(12) United States Patent
Radosavljevic et al.

(10) Patent No.: US 11,557,667 B2
(45) Date of Patent: Jan. 17, 2023

(54) GROUP III-NITRIDE DEVICES WITH IMPROVED RF PERFORMANCE AND THEIR METHODS OF FABRICATION

(71) Applicant: Intel Corporation, Santa Clara, CA (US)

(72) Inventors: Marko Radosavljevic, Portland, OR (US); Sansaptak Dasgupta, Hillsboro, OR (US); Han Wui Then, Portland, OR (US); Ibrahim Ban, Beaverton, OR (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 252 days.

(21) Appl. No.: 16/643,923

(22) PCT Filed: Sep. 30, 2017

(86) PCT No.: PCT/US2017/054679
§ 371 (c)(1),
(2) Date: Mar. 3, 2020

(87) PCT Pub. No.: WO2019/066995
PCT Pub. Date: Apr. 4, 2019

(65) Prior Publication Data
US 2020/0212211 A1 Jul. 2, 2020

(51) Int. Cl.
*H01L 29/778* (2006.01)
*H01L 29/66* (2006.01)
(Continued)

(52) U.S. Cl.
CPC ...... *H01L 29/7786* (2013.01); *H01L 21/0254* (2013.01); *H01L 21/30612* (2013.01);
(Continued)

(58) Field of Classification Search
None
See application file for complete search history.

(56) References Cited

U.S. PATENT DOCUMENTS

| 7,030,428 B2 | 4/2006 | Saxler |
| 8,492,867 B2 | 7/2013 | Yamamoto et al. |

(Continued)

OTHER PUBLICATIONS

K. Chen "Enhancement-mode AlGaN/GaN HEMT and MIS-HEMT technology" Phys. Status Solidi A 208, No. 2, Oct. 20, 2010 pp. 434-438 (Year: 2010).*

(Continued)

*Primary Examiner* — Grant S Withers
(74) *Attorney, Agent, or Firm* — Essential Patents Group, LLP

(57) ABSTRACT

A device including a III-N material is described. The device includes a transistor structure having a first layer including a first group III-nitride (III-N) material, a polarization charge inducing layer above the first layer, the polarization charge inducing layer including a second III-N material, a gate electrode above the polarization charge inducing layer and a source structure and a drain structure on opposite sides of the gate electrode. The device further includes a plurality of peripheral structures adjacent to transistor structure, where each of the peripheral structure includes the first layer, but lacks the polarization charge inducing layer, an insulating layer above the peripheral structure and the transistor structure, wherein the insulating layer includes a first dielectric material. A metallization structure, above the peripheral structure, is coupled to the transistor structure.

17 Claims, 19 Drawing Sheets

(51) Int. Cl.
| | |
|---|---|
| H01L 21/02 | (2006.01) |
| H01L 21/306 | (2006.01) |
| H01L 21/762 | (2006.01) |
| H01L 29/08 | (2006.01) |
| H01L 29/20 | (2006.01) |
| H01L 29/205 | (2006.01) |
| H01L 29/51 | (2006.01) |

(52) U.S. Cl.
CPC .... H01L 21/76224 (2013.01); H01L 29/0847 (2013.01); H01L 29/2003 (2013.01); H01L 29/205 (2013.01); H01L 29/517 (2013.01); H01L 29/66462 (2013.01)

(56) References Cited

U.S. PATENT DOCUMENTS

| | | | |
|---|---|---|---|
| 9,837,281 | B2* | 12/2017 | Jongbloed ............ H01L 21/0332 |
| 2009/0278236 | A1* | 11/2009 | Sato ..................... H01L 23/3121 |
| | | | 257/E23.179 |
| 2012/0032188 | A1* | 2/2012 | Kanamura .......... H01L 21/3228 |
| | | | 257/E21.403 |
| 2013/0271208 | A1 | 10/2013 | Then et al. |
| 2013/0313561 | A1 | 11/2013 | Suh |
| 2016/0315153 | A1 | 10/2016 | Then et al. |
| 2017/0301781 | A1* | 10/2017 | Boles .................. H01L 29/7786 |
| 2018/0033682 | A1* | 2/2018 | Chern .................. H01L 27/0605 |
| 2018/0240753 | A1* | 8/2018 | LaRoche .............. H01L 23/481 |
| 2020/0220004 | A1* | 7/2020 | Radosavljevic .... H01L 29/7787 |

OTHER PUBLICATIONS

Kotani, J. "Suppression of gate leakage current in in-situ grown AlN/InAlN/AlN/GaN heterostructures based on the control of internal polarization fields" J. of App. Phys. 121 115704 Mar. 20, 2017 (Year: 2017).*

Chen, C-H "High transconductance self-aligned AlGaN/GaN modulation-doped field-effect transistor with regrown ohmic contacts" App. Phys. Lett. 73 3147 Nov. 23, 1998 pp. 3147-3149 (Year: 1998).*

Chen, D-Y "Optimization of Ohmic contacts and surface Passivation for 'Buffer-Free' GaN HEMT Technologies" Thesis copyright 2020 pp. 2-54 (Year: 2020).*

Bakeroot, B. "On the origin of the two-dimensional electron gas at AlGaN/GaN heterojunctions and its influence on recessed-gate metal-insulator-semiconductor high electron mobility transistors" Jour. of App. Phys. 116 published Oct. 7, 2014 pp. 134506-1 through 134506-10 (Year: 2014).*

Hashizumi, T. "Surface passivation of GaN and GaN/AlGaN heterostructures by dielectric films and its application to insulated-gate heterostructure transistors" J. Vac. Sci Tech. B 21(4) Jul./Aug. 2003 pp. 1828-1838 (Year: 2003).*

Lee, K. "Optimal III-nitride HEMTs—From Materials and Device Design to Compact model of the 2DEG charge density" Proc. of SPIE vol. 10104, Feb. 2017 pp. 1010418-1 through 1010418-16 (Year: 2017).*

Pearton et al. ("Pearton" Pearton, S. "Gallium Nitride Processing for Electonics, Sensors and Spintronics, Chapter 6" copyright 2006 pp. 313-360) (Year: 2006).*

Li, Z. "Isolation Methods for GaN Lateral MOS-Channel HEMTs" Conf: Lester Eastman Conf. on High Perf. Dev. (LEG) 2012 Aug. 2012 pp. 1-3 (Year: 2012).*

Chakroun, A. "Normally-off AlGaN/GaN MOS-HEMT using ultrathin Al0.45Ga0.55N barrier layer" Phys. Status. Solidi A 214, No. 8, published May 18, 2017, pp. 1-4 (Year: 2017).*

Jiang, Q. "A High-Voltage Low-Standby-Power Startup Circuit Using Monolithically Integrated E/D-Mode AlGaN/GaN MIS-HEMTs" IEEE Trans. on Elec. Dev. vol. 61, No. 3, Mar. 2014 pp. 762-768 (Year: 2014).*

International Search Report and Written Opinion from PCT/US2017/054679 notified Jun. 29, 2018, 18 pgs.

International Preliminary Report on Patentability from PCT/US2017/054679 notified Apr. 9, 2020, 13 pgs.

\* cited by examiner

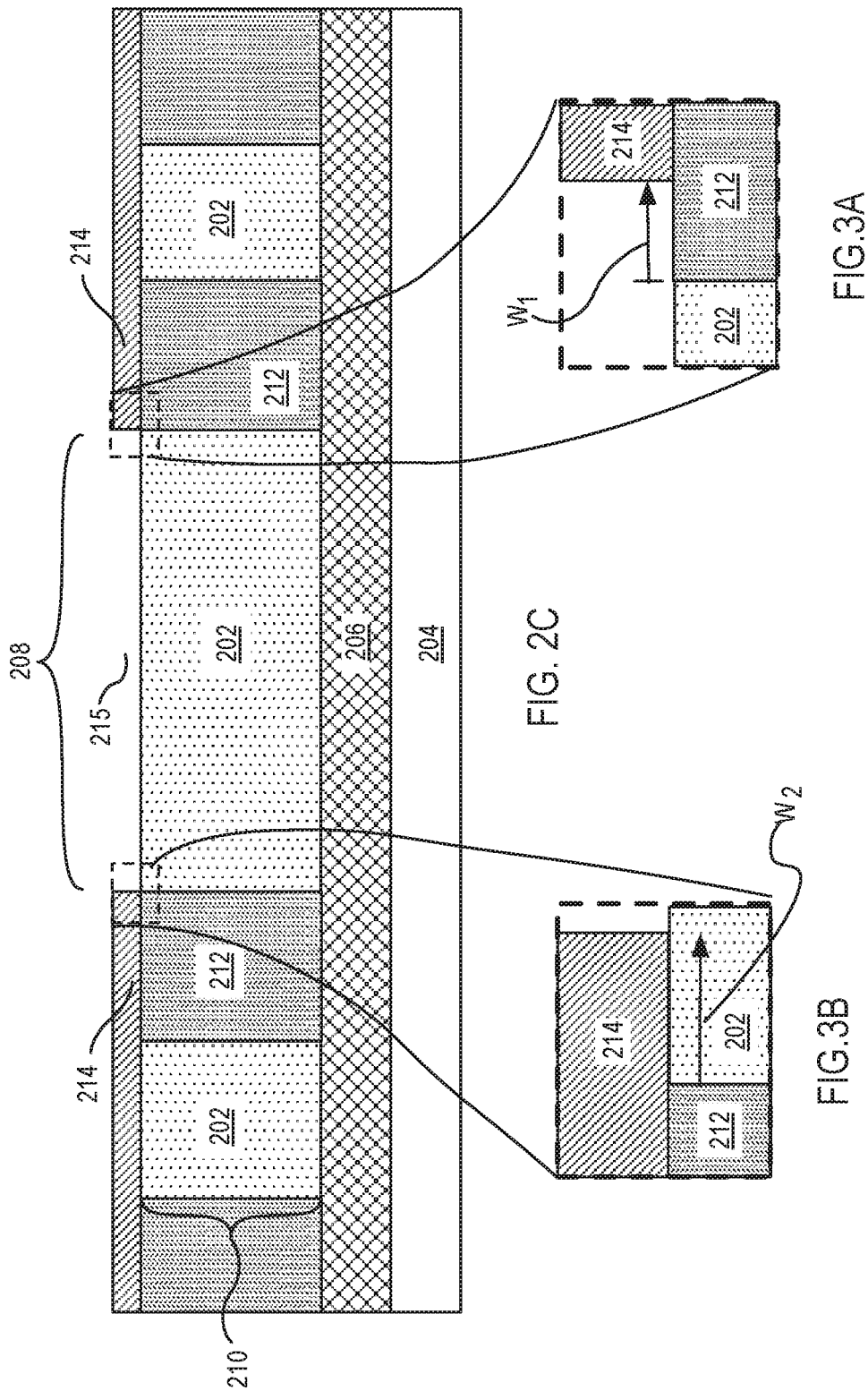

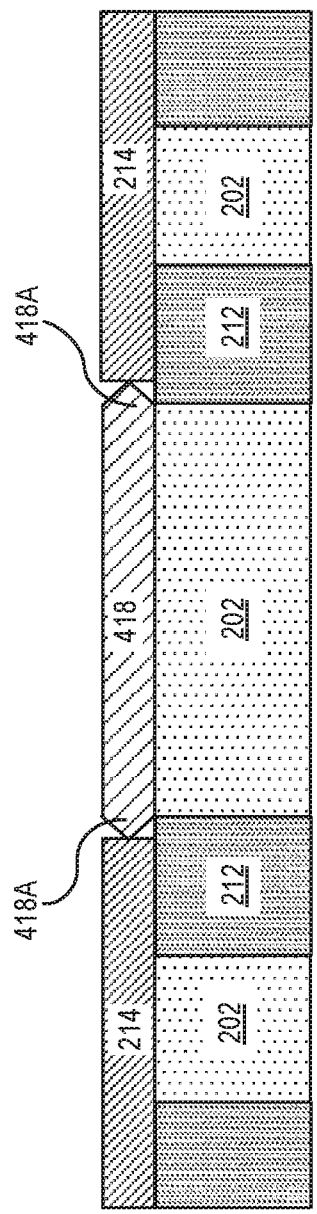
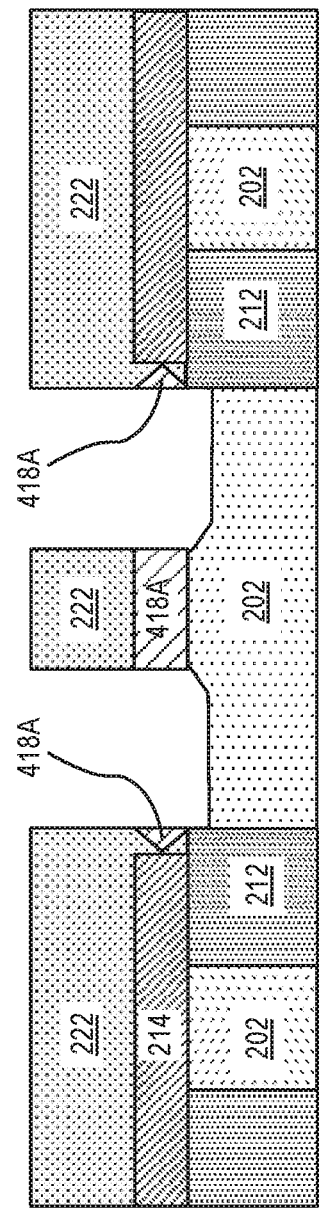
FIG. 4A
FIG. 4B

GROUP III-NITRIDE DEVICES WITH IMPROVED RF PERFORMANCE AND THEIR METHODS OF FABRICATION

CLAIM OF PRIORITY

This Application is a National Stage Entry of, and claims priority to, PCT Application No. PCT/US2017/054679, filed on Sep. 30, 2017 and titled "GROUP III-NITRIDE DEVICES WITH IMPROVED RF PERFORMANCE AND THEIR METHODS OF FABRICATION", which is incorporated by reference in its entirety for all purposes.

BACKGROUND

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more diodes in conjunction with one or more transistors, such as one or more field-effect transistors (FETs). Due, in part, to their large bandgap and high mobility, gallium nitride (GaN) and other group III-nitride (III-N) materials are suited for integrated circuits for applications such as high-frequency and high-power.

For many non-silicon materials, it can be challenging to pattern substrates and remove extraneous elements which can potentially cause performance degradation. Thus, selective growth of electrically active structures and techniques to improve RF performance are active areas of on-going III-N device development.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 2C illustrates a cross-sectional view of the structure of FIG. 2B following the formation of cap structures above the peripheral structures.

FIG. 2I illustrates a cross-sectional view of the structure of FIG. 2H following the formation of a gate structure in the opening and on the polarization charge inducing layer.

FIG. 3A illustrates a cross-sectional view of the cap formed away from an interface between the first layer and the isolation.

FIG. 3B illustrates a cross-sectional view of the cap formed over the interface between the first layer and the isolation.

FIG. 4A illustrates a cross-sectional view of the structure of FIG. 2D where the polarization charge inducing layer is formed above a portion of the isolation.

FIG. 4B illustrates a cross-sectional view of the structure of FIG. 4A following the formation of a mask and patterning of the polarization charge inducing layer and the first layer.

DESCRIPTION OF THE EMBODIMENTS

Figure 1A:
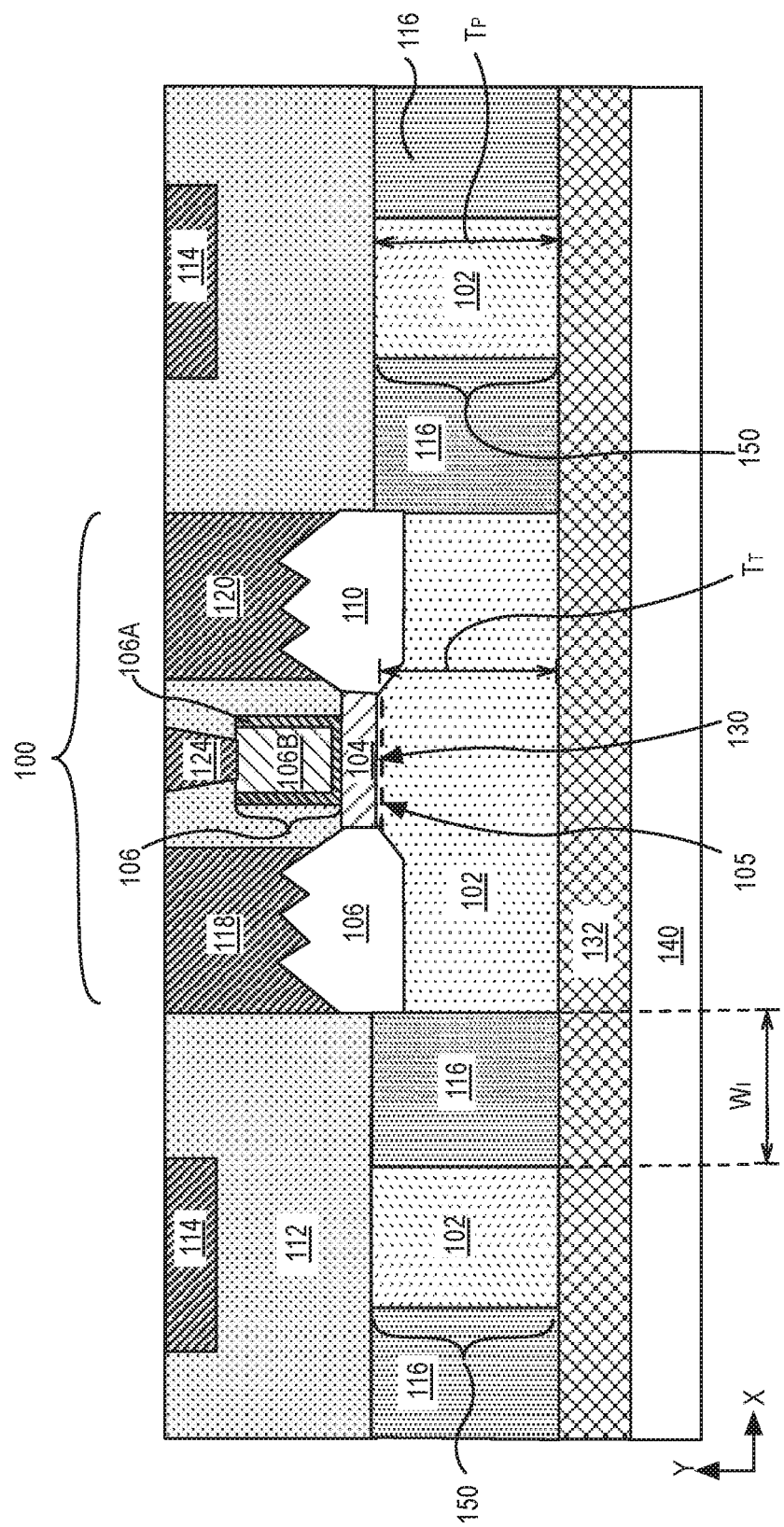
FIG. 1A illustrates a cross-sectional view of a III-N transistor and a plurality of electrically inactive peripheral structures, in accordance with embodiments of the present disclosure.

Devices including III-N materials for logic, SoC and memory applications and their methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as enhancement mode operations associated with group III-N devices, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more transistors, such as one or more field-effect transistors (FETs). Due, in part, to their large bandgap and high mobility, gallium nitride (GaN) and other III-N materials are suited for integrated circuits for applications such as high-frequency and high-power. However, optimizing power efficiency of RF-front end components and minimizing energy loss during operation is highly desirable. Devices such as transistors fashioned from III-N materials, may be susceptible to energy loss from various sources such as from conduction and switching losses. The latter is affected by the transition between "on" and "off" states during device operation. In particular, transitioning between on and off states of the transistor may be affected by RF currents induced in the circuitry by peripheral sources. Eliminating sources of current from electromagnetic effects arising from peripheral structures that are required merely for process uniformity, is highly desirable. Thus, schemes that minimize RF interference to active devices are especially attractive for practical realization of devices based on III-N materials.

Fabrication of III-N transistors requires isolation from peripheral circuitry. For practical reasons, the layout of the transistor circuitry thus, includes large regions of peripheral structures surrounding a single or a collection of transistors separated by a sea of isolation. While some peripheral structures can be utilized for active device development, most peripheral structures act as dummy structures to minimize variations in processing across a die, collection of dies or the entire wafer. As many of the layers in the peripheral structures are grown or deposited at the same time as the layers in the active device area, these peripheral structures can induce undesirable electrical performance in nearby transistors. For example, RF losses may stem from eddy currents in metallization structures that are connected to a source or a drain terminal of the transistor. Thus, reducing parasitics associated with such peripheral structures are of high importance in integrated circuits including III-N devices that operate at high frequency, where RF losses are a key performance limiter. By selectively forming certain layers only in active device areas without additional cumbersome processing operations, the peripheral structures can serve their function during device fabrication without impacting active device function during operation.

In an embodiment of the present disclosure, a device includes a transistor surrounded by a plurality of peripheral structures. The transistor includes a first layer having a III-N material, and a polarization charge inducing layer including a second III-N material above the first III-N material terminal. The polarization charge inducing layer induces a 2-dimensional electron gas (2DEG) in the first layer below an interface between the polarization charge inducing layer and the underlying first III-N material of the first layer. The 2DEG enables III-N materials to become electrically active. A gate electrode is on the polarization charge inducing layer. The transistor further includes a source structure and a drain structure each having an impurity dopant and including a third III-N material, on opposite sides of the gate electrode. The plurality of peripheral structures surrounding the transistor structure includes the first layer, but lacks the polarization charge inducing layer. Therefore, a 2DEG is not developed within the peripheral structures. A layer of dielectric material is above the peripheral structure and the transistor structure. A metallization structure is coupled to the transistor structure above the peripheral structure. Absent the 2DEG, RF losses attributable to parasitic coupling between the metallization structure and the peripheral structures may be significantly reduced.

FIG. 1A illustrates a cross-sectional view of a III-N transistor 100 adjacent to a plurality of electrically inactive peripheral structures 150, in accordance with embodiments of the present disclosure. The transistor 100 includes a channel layer 102 having a III-N material, and a polarization charge inducing layer 104 including a III-N material above the channel layer 102. The polarization charge inducing layer 104 induces a 2-dimensional electron gas (2DEG is indicated by the dashed lines 105) within channel layer 102 near an interface 130 between the polarization charge inducing layer 104 and the channel layer 102. The 2DEG enables a portion of the channel layer 102 to become electrically active. The transistor 100 further includes a gate 106 above the polarization charge inducing layer 104, a source structure 108 on one side of the gate 106 and a drain structure 110 on another side of gate 106 opposite the source structure 108. The gate 106, further includes a gate dielectric layer 106A on the polarization charge inducing layer 104 and a gate electrode 106B on the gate dielectric layer 106A. The transistor further includes a source contact 118 on and coupled to the source structure 108, a drain contact 120 on and coupled to the drain structure 110 and a gate contact 124 on and coupled to the gate 106.

The plurality of peripheral structures 150, adjacent to the transistor 100, includes the channel layer 102, but lacks the polarization charge inducing layer 104. Without the polarization charge inducing layer 104, the plurality of peripheral structures 150 lack a 2DEG. An insulating layer 112 is above the plurality of peripheral structures 150 and the transistor 100, where the insulating layer 112 includes a first dielectric material.

A metallization structure 114 is coupled to the transistor 100 above the plurality of peripheral structures 150. In an embodiment, the metallization structure is coupled to a source contact 118, or a drain contact 120, of the transistor 100.

An isolation 116 is between the channel layer 102 of the transistor 100 and the first layer of the plurality of peripheral structures 150. In an embodiment, isolation has a width, $W_I$. In an embodiment, $W_I$, is between 150 nm-300 nm and provides adequate electrical isolation between the transistor 100 and each adjacent peripheral structure 150 for the transistor 100 to operate at voltages greater than 2V, for example.

In an embodiment, the channel layer 102 has a thickness $T_T$, in the transistor 100 and a thickness $T_P$ in the plurality of peripheral structures 150. In the illustrative embodiment, the channel layer 102 has a thickness $T_T$ in the transistor 100 that is equal to a thickness $T_P$ of the channel layer 102 in the plurality of peripheral structures 150. A thickness T, equal to thickness $T_P$ may be indicative of selective formation of the polarization charge inducing layer 104, as will be discussed further below.

In an embodiment, the channel layer 102 includes a gallium nitride (GaN) alloy. In one such embodiment, the channel layer 102 has a relatively high carrier mobility, (greater than 500 cm$^2$ V$^{-1}$). The channel layer 102 may be a substantially un-doped III-N material (i.e., O$_2$ impurity concentration minimized) for minimal impurity scattering. In other embodiments, the channel layer 102 includes one or more ternary alloys of GaN, such as AlGaN, AlInN, or a quaternary alloy of GaN including at least one group III element and nitrogen, such as In$_x$Al$_y$Ga$_{1-x-y}$N, where x ranges from 0.01-0.1 and y ranges from 0.01-0.1. Depending on applications, the channel layer 102 has a material thickness approximately in the range of 100 nm-5 μm.

In an embodiment, the polarization charge inducing layer 104 includes a suitable second III-N material. In an embodiment, the polarization charge inducing layer 104 includes a material such as but not limited to Al$_z$Ga$_{1-z}$N, Al$_w$In$_{1-w}$N, or AlN, where Z ranges from 0.2-0.3 and W ranges from 0.7-0.85. One combination includes a polarization charge inducing layer 104 that is AlGaN and a channel layer 102 that is GaN. In one such combination, the AlGaN polarization charge inducing layer 104 has a bandgap (3.7 eV) that is wider than the bandgap of the GaN III-N material 102 (3.4 eV), facilitating a band offset at the interface between the AlGaN polarization charge inducing layer 104 and the GaN III-N material 102. The presence of the 2DEG enables current conduction between the source structure 108 and the drain structure 110 in the device 100. In the illustrated embodiment, by negatively biasing the gate electrode 106 relative to the drain contact 110, the 2DEG is turned off.

The gate dielectric layer 106A may have a high relative permittivity (i.e., dielectric constant, K). In some high-K gate dielectric embodiments, the gate dielectric layer 106A is a metal oxide (e.g., including oxygen and one or more metals, such as, but not limited to, aluminum, hafnium, zirconium, tantalum or titanium). In another embodiment, the gate dielectric layer 106A includes a silicon dioxide or a silicon nitride. In some examples, the gate dielectric layer 106A has a thickness between 2 nm and 10 nm.

In an embodiment, the gate electrode 106B includes a metal such as but not limited to Pt, Ni and an alloy such as TiN or TaN. In one such embodiment, the gate electrode 106B has a length, $L_G$, approximately in the range of 10-30 nm. In some embodiments, the gate electrode 106B further includes a work function metal and a gate cap. The work function metal may include a metal such as Pt, Ni, and an alloy such as TiN or TaN and the gate cap may include a metal such as W.

In an embodiment, the source structure 108 and drain structure 110, have uppermost surfaces that are above the level of the polarization charge inducing layer 104 and the isolation layer 118. In an embodiment, the source structure 108, drain structure 110 include a third III-N material that is lattice matched to the channel layer 102 of the channel layer 102. In one exemplary embodiment, where the channel layer 102 is GaN the source structure 108, drain structure 110 includes a single crystal of InGaN. In the illustrative embodiment, the source structure 108 and the drain structure 110 include faceted crystals having sidewalls that are approximately 60 degrees with respect to a plane of the layer of the substrate 140.

In an exemplary embodiment, the third III-N material includes an impurity dopant such as an n-type dopant. Examples of an n-type dopant includes a material such as Si or Ge. In one embodiment, the n-type dopant material is silicon. As a further example, the silicon n-type dopant may have a n-dopant density of at least 1e19/cm$^3$. Doping of the source structure 108 can reduce the bandgap between the source contact 108 and the source structure 108. Likewise, doping of the drain structure 110 can reduce the bandgap between drain contact 120 and the drain structure 110. A reduced bandgap may lead to a reduced contact resistance of the device 100.

In an embodiment, the source contact 118, and the drain contact 120 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

Examples of the isolation layer 112 may include any material that has sufficient dielectric strength to provide electrical isolation such as, but not to, limited silicon dioxide, silicon nitride, silicon oxynitride, carbon doped nitride and carbon doped oxide.

Examples of the isolation 116 may include any material that has sufficient dielectric strength to provide electrical isolation such as, but not to, limited silicon dioxide, silicon nitride, silicon oxynitride, carbon doped nitride and carbon doped oxide.

In an embodiment, the channel layer 102 is on a buffer layer 132. In an embodiment, the buffer layer 132 includes a III-N material such as but not limited to $Al_zGa_{1-z}N$, $Al_wIn_{1-w}N$, or AlN. In an embodiment, the buffer layer 132 minimizes crystal defects in the channel layer 102 that would ordinarily arise from lattice mismatch between the channel layer 102 and the underlying substrate 140. In an embodiment, the buffer layer 132 has a thickness that is between 100 nm-500 nm.

In an embodiment, the transistor 100 is on a substrate 140. In an embodiment, the substrate 140, includes a semiconductor material such as but not limited to silicon, silicon germanium (Ge) or silicon carbide (SiC). In an exemplary embodiment, the substrate 140 is a silicon substrate having a (100) top surface. A silicon substrate with a (100) top surface enables co-integration of silicon CMOS transistor technology with a III-N material. In a second embodiment, a silicon substrate, has a (111) top surface. In some embodiments, the buffer layer 132 and the substrate 140 have mismatched lattice structures. The lattice mismatch between the buffer layer 132 and the substrate 140 may be between 15%-50%.

Figure 1B:
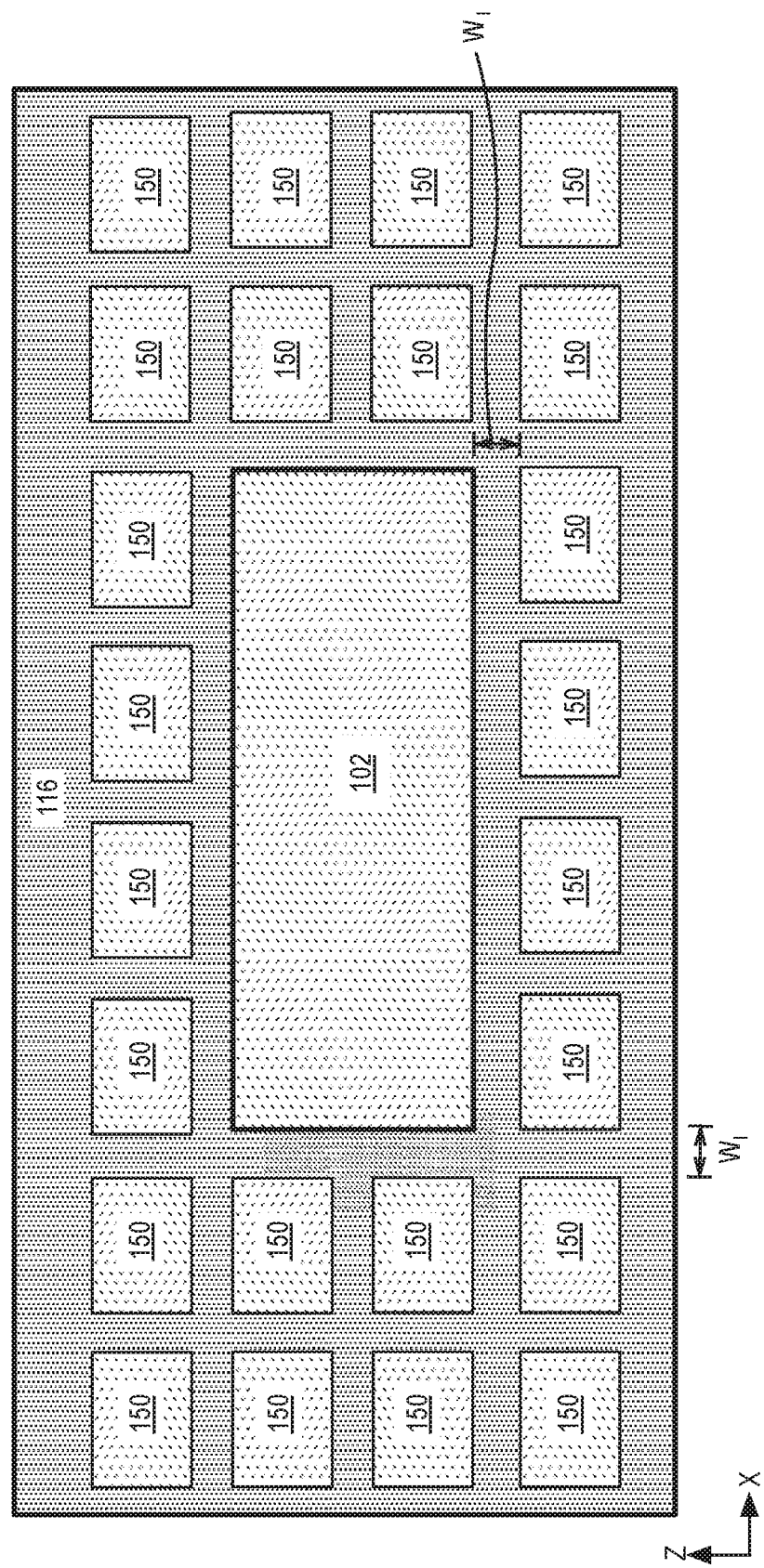
FIG. 1B illustrates a plan view of a layout of the III-N transistor and electrically inactive peripheral structures surrounding the III-N transistor in an accordance with an embodiment of the present disclosure.

FIG. 1B illustrates a plan view of a layout of the III-N transistor 100 and a plurality of peripheral structures 150 that are electrically inactive, surrounding the III-N transistor 100, in an accordance with an embodiment of the present disclosure. An isolation 116 is between the channel layer 102 of the transistor 100 and the first layer of the plurality of peripheral structures 150. In an embodiment, isolation has a width, $W_I$, in a region surrounding the transistor 100. In an embodiment, $W_I$, is between 150 nm-300 nm and provides adequate electrical isolation between the transistor 100 and the plurality of peripheral structures 150.

Figure 1C:
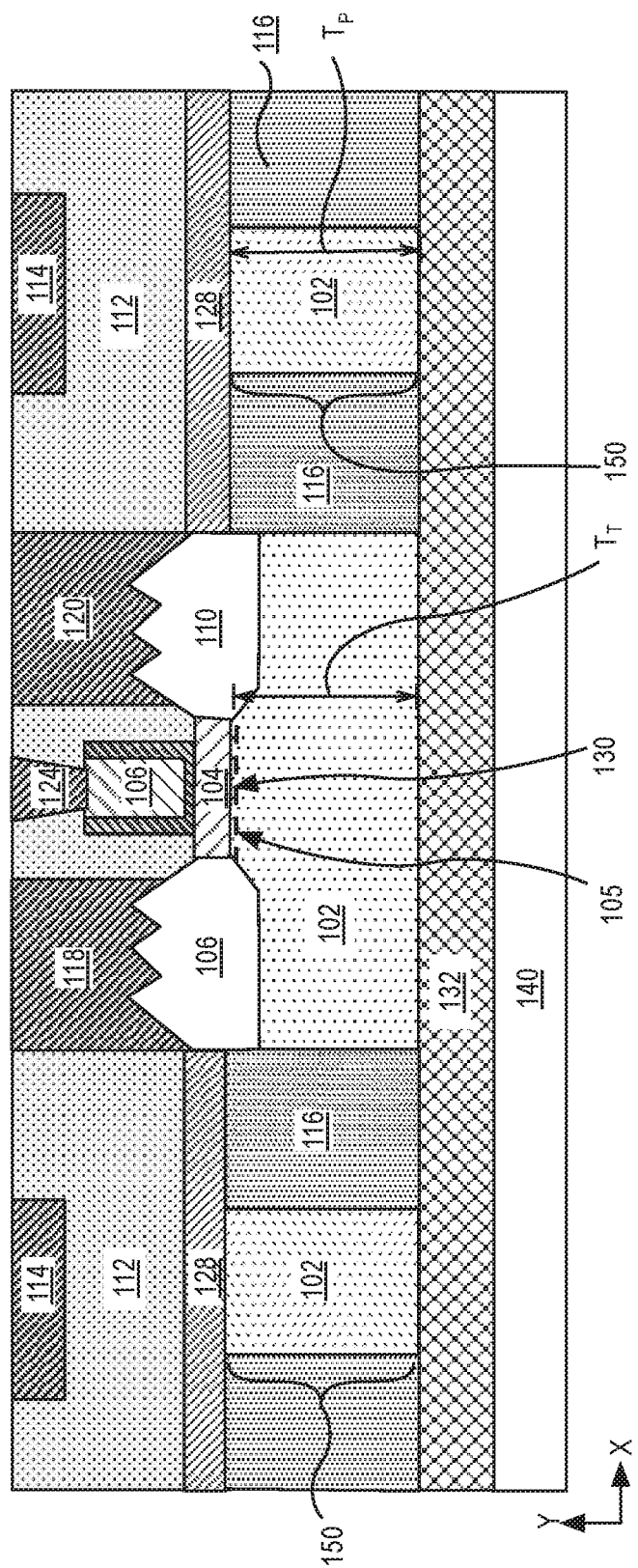
FIG. 1C illustrates a cross-sectional view of a functional III-N transistor and a plurality of electrically inactive peripheral structures, in accordance with embodiments of the present disclosure.

FIG. 1C illustrates a cross-sectional view of the III-N transistor 100 and plurality of peripheral structures 150, where the plurality of peripheral structures 150 further includes a cap 128 between the channel layer 102 and the insulating layer 112, wherein the cap 128 includes an amorphous material. In an embodiment, cap 128 is also on the isolation 116 as illustrated in the cross-sectional illustration of FIG. 1C but is absent from the transistor structure. In other embodiments, the cap 128 is on a portion of the isolation 116 (not shown). In addition to providing electrical isolation, the cap has a thickness to provide protection of the plurality of peripheral structures 150 during the fabrication process. In an embodiment, the cap has a thickness that is substantially greater than a thickness of the polarization charge inducing layer 104. When the polarization charge inducing layer 104, includes a layer of AlGaN, the polarization charge inducing layer 104 has a thickness that may be comparable to the cap layer 128. In some embodiments, the cap 128 has a thickness that may vary depending on whether the cap is exposed and utilized as an etch stop layer during the fabrication process.

As a further enablement, a second plurality of peripheral structures may exist in the insulating layer 112 above the plurality of peripheral structures 150 to enable processing uniformity. The presence of the cap layer 128 may provide further insulation between the second plurality of peripheral structures and the plurality of peripheral structures 150 and act as an etch stop during formation of the second plurality of peripheral structures.

In an embodiment, the cap 128 includes a dielectric material. Examples of the dielectric material may include any material that that has sufficient dielectric strength provide electrical isolation such as, but not to, limited silicon dioxide, silicon nitride, silicon oxynitride, carbon doped nitride and carbon doped oxide. In an embodiment, the cap 128 includes a material that is the same or substantially the same as the insulating layer 112. In an embodiment, cap 128 includes a first dielectric material, and the insulating layer 112 includes a second dielectric material. For example, the insulating layer may include a silicon nitride, silicon oxynitride, carbon doped silicon nitride, and the insulating layer 112 includes a silicon dioxide or a carbon doped silicon oxide. In an embodiment, the cap 128 includes a material that is the same or substantially the same as the isolation 116. In an embodiment, cap 128 includes a dielectric material, that is different from a dielectric material of the isolation 116. For example, the insulating layer 112 may include a silicon nitride, silicon oxynitride, carbon doped silicon nitride, and the isolation 116 may include a silicon dioxide or a carbon doped silicon oxide.

FIGS. 2A-2L illustrate cross-sectional views representing various operations in a method of fabricating a III-N transistor, in accordance with embodiments of the present disclosure.

Figure 2A:
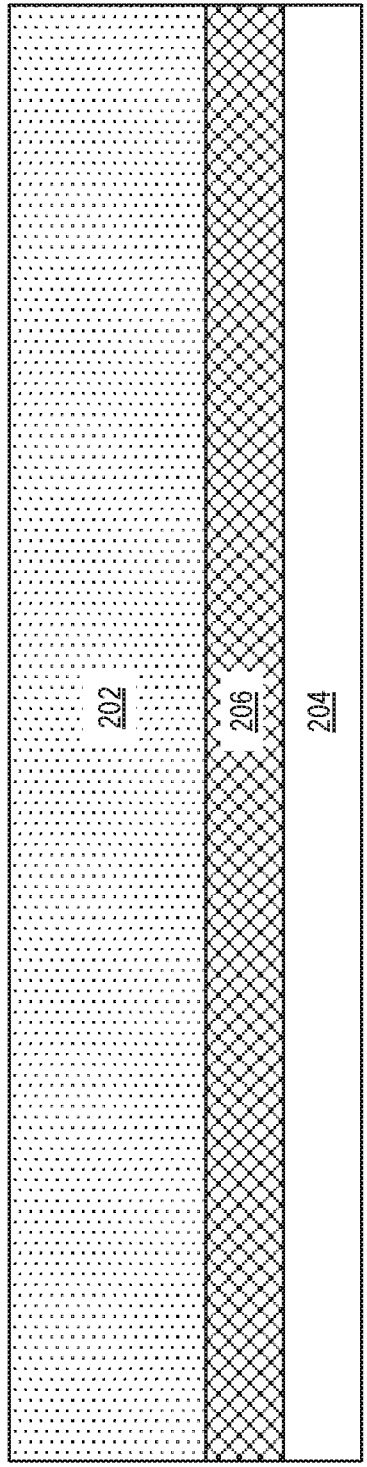
FIG. 2A illustrates a cross sectional view of a first III-N material above a substrate and a second III-N material on the first III-N material.

FIG. 2A illustrates a cross sectional view of a first III-N layer 202 on a buffer layer 206 formed above a substrate 218. In an embodiment, the substrate 218, includes a semiconductor material such as but not limited to silicon, silicon germanium (Ge) or silicon carbide (SiC). In an exemplary embodiment, the substrate 218 is a silicon substrate having a (100) top surface. A silicon substrate 218 with a (100) top surface enables co-integration of silicon CMOS transistor technology with a III-N material. In a second embodiment, the silicon substrate 218, has a (111) top surface. In embodiments, the buffer layer 206 and the substrate 218 have mismatched lattice structures. The lattice mismatch between the buffer layer 206 and the substrate 218 may be between 15%-50%.

In an embodiment, the buffer layer 206 is formed between the first III-N layer 202 and the substrate 218 to overcome lattice and thermal mismatch between the substrate 218 and the buffer layer 206. In an embodiment, the buffer layer 206 is grown on the substrate 218 by a metal organic chemical vapor deposition (MOCVD) process at a temperature in the range of 1000-1100 degrees Celsius. In an embodiment, the buffer layer 206 has a material composition that is the same or substantially the same as the buffer layer 206. In an exemplary embodiment, the buffer layer 206 includes AlGaN. The buffer layer 206 including AlGaN may be grown to a thickness between 100 nm-200 nm to minimize lattice mismatch between the first III-N layer 202 and the substrate 218.

In an embodiment, the first III-N layer 202 is grown on the substrate 218 by a metal organic chemical vapor deposition (MOCVD) process at a temperature in the range of 1000-1100 degrees Celsius. In an embodiment, the first III-N layer 202 has a material composition that is the same or substantially the same as the first III-N material the channel layer 102 descried in association with FIG. 1A. In an embodiment, the first III-N layer 202 is a GaN layer. In an embodiment, the GaN III-N material 202 is grown to a thickness that is approximately in the range of 100 nm-5 micrometers. The first III-N layer 202 may have a defect density less than (1e10/cm2) when grown to a sufficient thickness, such as a thickness of at least 100 nm.

In an embodiment, exemplary embodiment, the substrate 218 includes silicon, the buffer layer 206 includes AlGaN and the first III-N layer 202 includes a single crystal GaN.

Figure 2B:
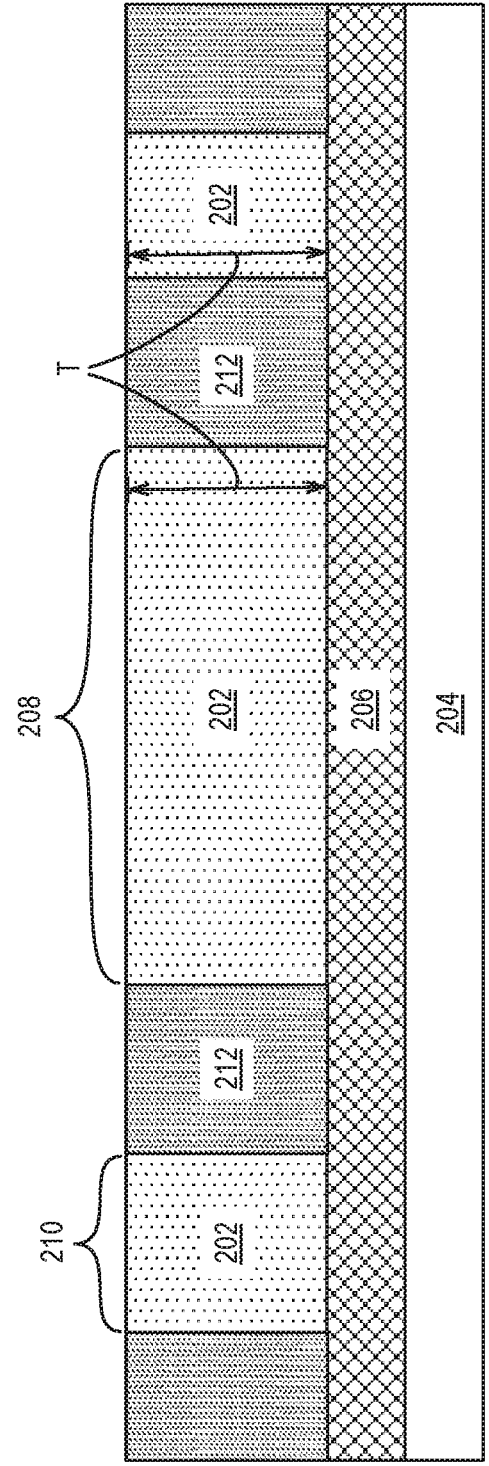
FIG. 2B illustrates a cross-sectional view of the structure of FIG. 2A following the formation of a transistor region and peripheral structures surrounding the transistor region, in accordance with an embodiment of the present disclosure.

FIG. 2B illustrates a cross-sectional view of the structure of FIG. 2A following the formation of a transistor region 208 and plurality of peripheral structures 210 surrounding the transistor region 208, in accordance with an embodiment of the present disclosure.

In an embodiment, a mask (not shown) is formed on the first III-N layer 202. The mask defines where a transistor, isolation, and a plurality of peripheral structures will be made. An etch process such as, for example, a plasma etch process may be utilized to etch the first III-N layer 202 through an exposed area in the mask. The plasma etch process patterns the first III-N layer 202 and forms trenches, exposing the underlying buffer layer 206 in the trenches. The patterned first III-N layer 202 provides a transistor region 208 where a III-N transistor will be fabricated and defines the plurality of peripheral structures 210. A first dielectric layer is then deposited on the patterned first III-N layer 202 filling the trenches. In a subsequent processing operation, the first dielectric layer is then planarized forming isolation 212 in the trenches. The isolation 212 separates the transistor region 208 from the plurality of peripheral structures 210. The planarization process may utilize, for example, a chemical mechanical polish (CMP) process. In the embodiment depicted in the cross-sectional illustration of FIG. 2B, the CMP process forms the isolation 212 having an uppermost surface that is co-planar or substantially co-planar with an uppermost surface of the first III-N layer 202. The planarization process also results in the first III-N layer 202 having an approximately uniform thickness, T, in both the plurality of peripheral structures 210 and in the transistor region 210.

FIG. 2C illustrates a cross-sectional view of the structure of FIG. 2B following the formation of cap structures 214 above the plurality of peripheral structures 210. In an embodiment, a cap 214 is blanket deposited onto an uppermost surface of the first III-N layer 202 in the transistor region 208, on the plurality of peripheral structures 210 and on the isolation 212. The cap 214 may include a material having a composition that is the same or substantially the same as the cap 128 described in association with FIG. 1C. In some exemplary embodiments, the cap 214 includes a silicon nitride, a silicon oxynitride or a carbon doped silicon nitride to provide etch resistance against patterning of silicon oxide, silicon carbide or carbon doped silicon oxide type materials in subsequent downstream processing operations.

In an embodiment, a mask (not shown) is formed on the cap 214. In one embodiment, a plasma etch process is utilized to etch the cap 214 through an exposed area in the mask to form an opening 215. It is to be appreciated that the opening 215 is aligned with a periphery of the transistor region 208 as shown in the cross-sectional illustration of FIG. 2C. It is to be appreciated that the first III-N layer 202 in the transistor region 208 is not etched during the formation of opening 215 and the height, T, of the first III-N layer 202 in the transistor region 208 is unaffected.

The mask utilized to form the opening 215 may not be perfectly aligned with an outline of the transistor region 208. In such instances, the cap 214 does fully cover the isolation 216, causing a portion of the isolation 212 to become exposed as illustrated in FIG. 3A. In the illustrative embodiment, the cap is laterally recessed a distance, $W_1$, away from a vertical interface between the first III-N layer 202 and the isolation 212.

Furthermore, misalignment between the mask and the outline of the transistor region 208 may also lead to an interface between the first III-N layer 202 and the isolation 212 to become partially covered by the cap 214 as illustrated in FIG. 3B. In the illustrative embodiment, the cap is laterally extended a distance, $W_2$, away from a vertical interface between the first III-N layer 202 and the isolation 212 and onto a portion of the first III-N layer 202.

In another embodiment, the opening 215 may have an area that is larger than an area of the transistor region 208 by design. In one such embodiment, the cap layer exposes a portion of the isolation 212 around the entire transistor region 208 (as will be discussed in FIGS. 4A-4C below).

Figure 2D:
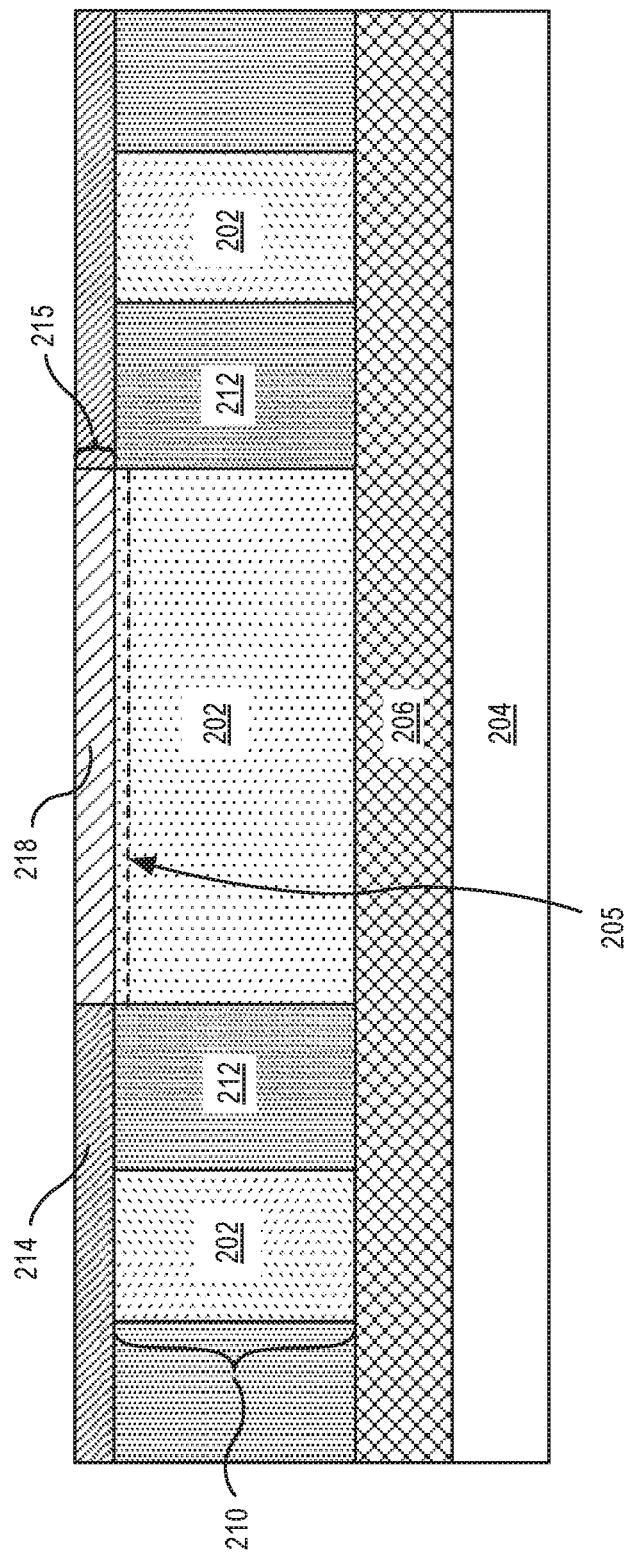
FIG. 2D illustrates a cross-sectional view of the structure of FIG. 2C following the formation of a polarization charge inducing layer on the second III-N material in the transistor region.

FIG. 2D illustrates a cross-sectional view of the structure of FIG. 2C following the formation of a polarization charge inducing layer 218 on the first III-N layer 202 in the transistor region 202. In an embodiment, the polarization charge inducing layer 218 is grown on the first III-N material by a metal organic chemical vapor deposition (MOCVD) process at a temperature in the range of 1000-1100 degrees Celsius. In an embodiment, the polarization charge inducing layer 218 grows to fill the opening 215. In one such embodiment, vertical sidewalls of the polarization charge inducing layer 218 grow to make contact with sidewalls of the cap 214 filling the opening 215. Depending on the embodiment, the polarization charge inducing layer 218 includes a material such as but not limited to AlN, AlInN or $Al_yGa_{1-y}N$ (where y is 0.24-0.36) and the first III-N layer 202 includes a material such as but not limited to InGaN or GaN. In an exemplary embodiment, the polarization charge inducing layer 218 includes an AlGaN. In an exemplary embodiment, the polarization charge inducing layer 218 is AlInN. A polarization charge inducing layer 218 having a thickness between 3 nm-10 nm induces 2DEG (represented by dashed lines 205) in an uppermost surface between polarization charge inducing layer 218 and the first III-N layer 202.

Figure 2E:
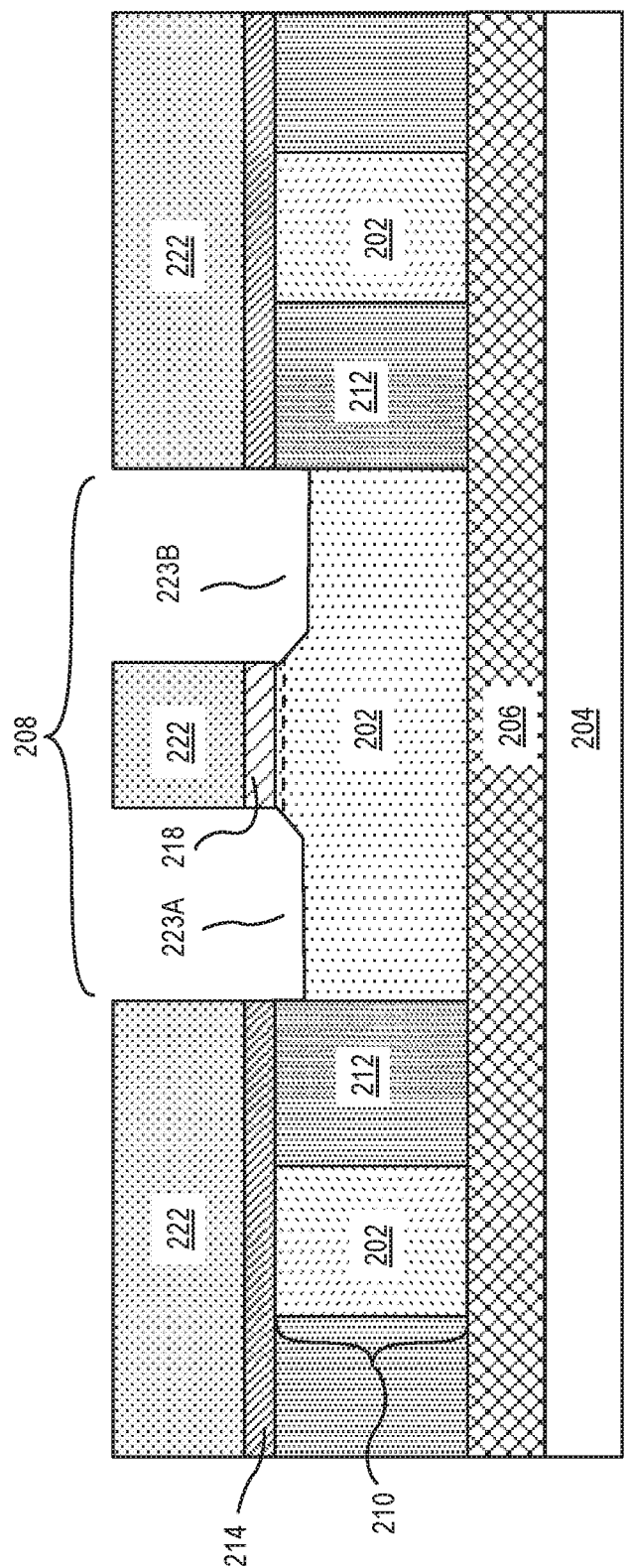
FIG. 2E illustrates a cross-sectional view of the structure of FIG. 2D following the formation of trenches in portions of the polarization charge inducing layer, and in portions of the second III-N material adjacent to isolation structures.

FIG. 2E illustrates a cross-sectional view of the structure of FIG. 2D following the formation of trenches in portions of the polarization charge inducing layer, and in portions of the second III-N material adjacent to isolation structures.

In an embodiment, a mask 222 is formed on a portion of the polarization charge inducing layer 218. In an embodiment, a second dielectric material that can withstand high temperature processing such as a silicon oxide or a silicon nitride is blanket deposited onto the structure of FIG. 2D to form the mask 222. In an embodiment, a plasma etch process is utilized to pattern the second dielectric layer to define the mask 222. In a subsequent plasma etch operation, the first III-N layer 202 in the transistor region 208 and the polarization charge inducing layer 218 uncovered by the mask 222, are patterned to form trenches 223A and 223B as shown in the cross-sectional illustration of FIG. 2E. Trenches 223A and 223B may be recessed by an amount between 30 nm and 60 nm.

In an embodiment, the patterned first III-N layer 202 in the transistor region 208, shown in the cross-sectional illustration of FIG. 2E, has sloped sidewalls and an approximately flat lowermost surfaces 202E. If a portion of the transistor region 208 is covered by the cap 214 as illustrated in FIG. 3B, then the portion of first III-N layer 202 in the vicinity of the cap may also have a slanted sidewall. The trenches 223A and 223B may have a height and width chosen to enable subsequent epitaxial formation of source and drain structures having a contact resistance of less than 200 ohms-micron.

Figure 2F:
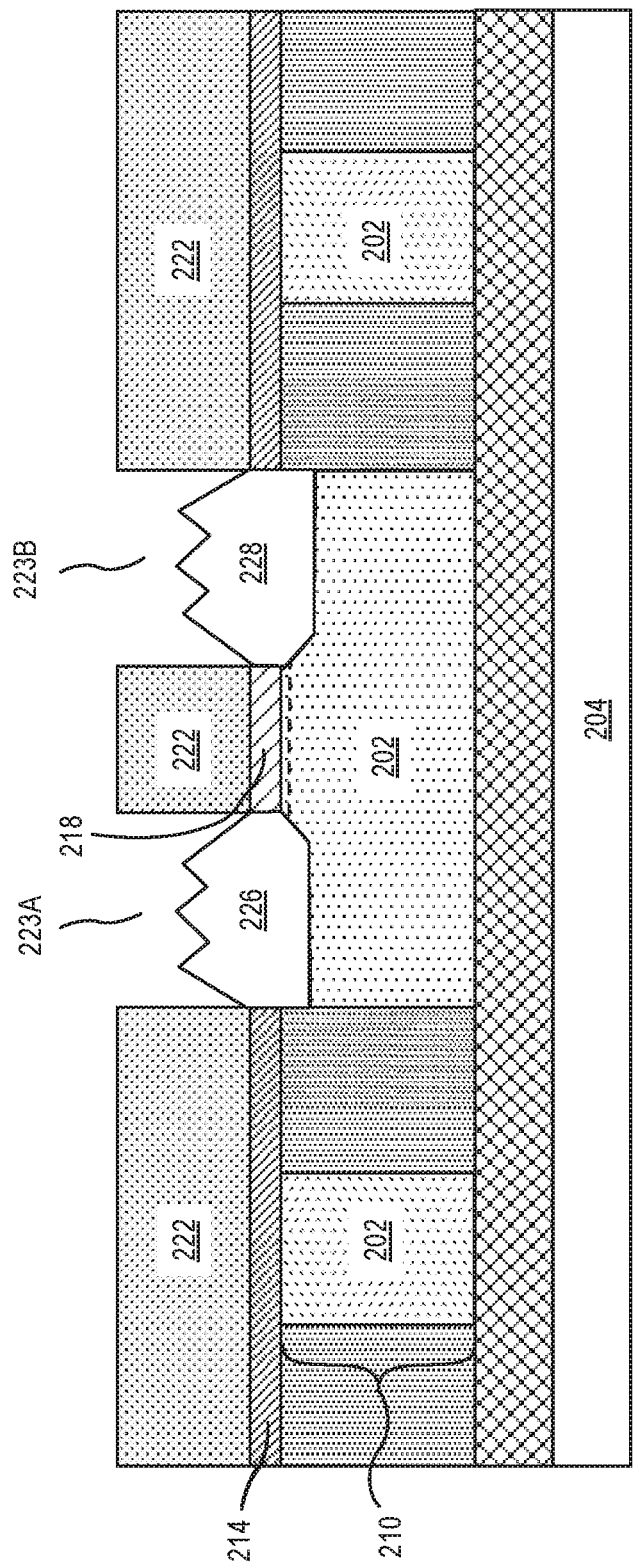
FIG. 2F illustrates a cross-sectional view of the structure of FIG. 2E following the formation of drain structures and source structures in the trenches.

FIG. 2F illustrates a cross-sectional view of the structure of FIG. 2E following the formation of drain structures 226 and source structures 228 in the trenches 223A and 223B, respectively. In an embodiment, the source structure 226 and the drain structure 228 include a third III-N material that is the same or substantially the same as the third III-N material of the source structure 108 and drain structure 110, respectively. Epitaxial growth of drain structure 228 crystalline material may utilize a variety of techniques and processing chamber configurations. In the illustrated embodiment, in a process known as lateral epitaxial overgrowth (LEO), conditions are engineered to favor advancing a lateral growth face of a nucleated crystal of the source structure 226 and the drain structure 228.

In an embodiment, the source structure 226 and the drain structure 228 are grown from the exposed, undamaged surface of first III-N layer 202 in the trenches 223A and 223B using a metal organic chemical vapor deposition MOCVD process. The MOCVD process may be carried out at process temperatures between 1000 and 1100 degrees Celsius. In an embodiment, the source structure 226 and the drain structure 228, are epitaxially grown sufficiently thick to fill trenches 223A and 223B respectively and extend vertically to a have a height, $H_E$, as measured from the bottom of the trench 223A or 223B. The cross-sectional illustration in FIG. 2F represents an embodiment of the source structure 226 and the drain structure 228 having corrugated upper surfaces. In some examples, the corrugation is between 5 nm-20 nm. In an embodiment, when the cap 214 and the mask 222 does not cover a portion of the isolation 212 as illustrated in FIG. 3A, the source structure 226 or the drain structure 228 may extend over uncovered portions of the isolation 212 (not shown).

Figure 2G:
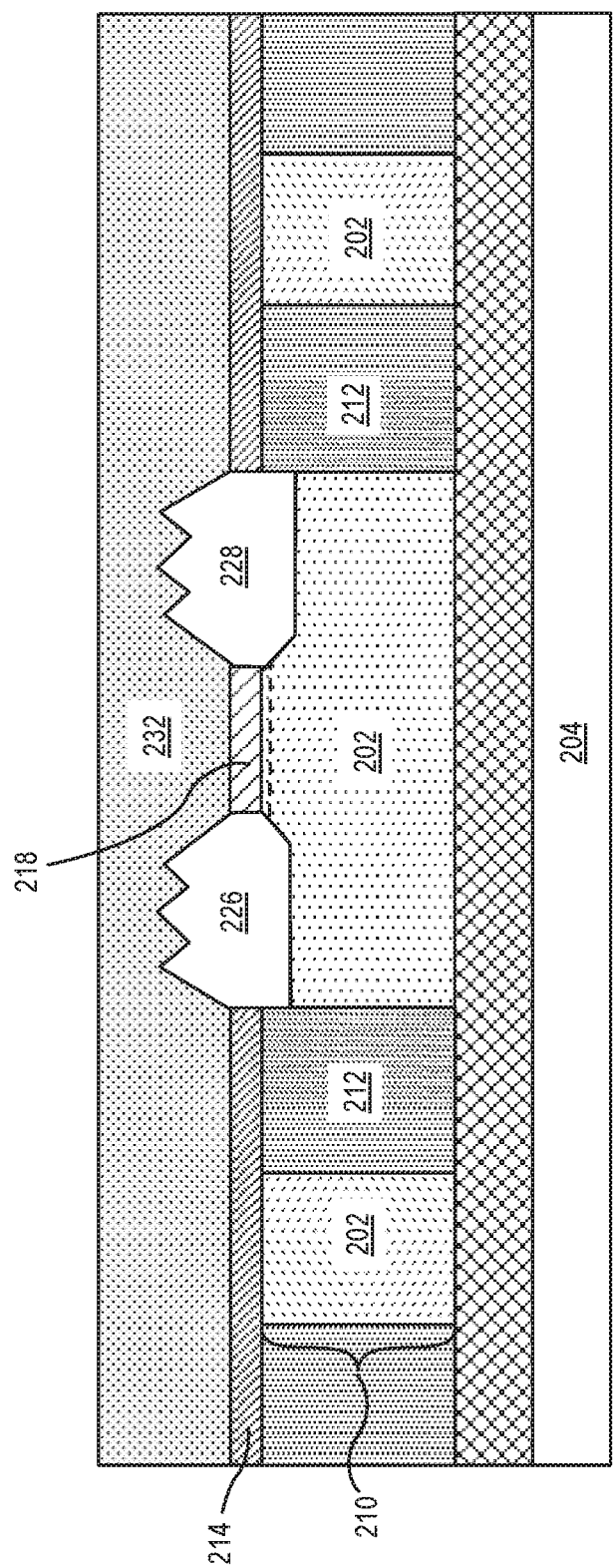
FIG. 2G illustrates a cross-sectional view of the structure of FIG. 2F following the removal of the masking layer and deposition of a dielectric layer on the source structure, drain structure, on the polarization charge inducing layer and on the cap structures.

FIG. 2G illustrates a cross-sectional view of the structure of FIG. 2F following the removal of the mask 222 and deposition of a third dielectric layer 232 on the source structure 226, drain structure 228, on the polarization charge inducing layer 218 and on the cap 214. In an embodiment, the third dielectric layer 232 has a material composition that is the same or substantially the same as the material composition of the mask 222 described in association with FIG. 2E. In some examples, the third dielectric layer 232 is blanket deposited and then planarized for subsequent processing. The planarization process may utilize, for example, a chemical mechanical polish (CMP) process.

Figure 2H:
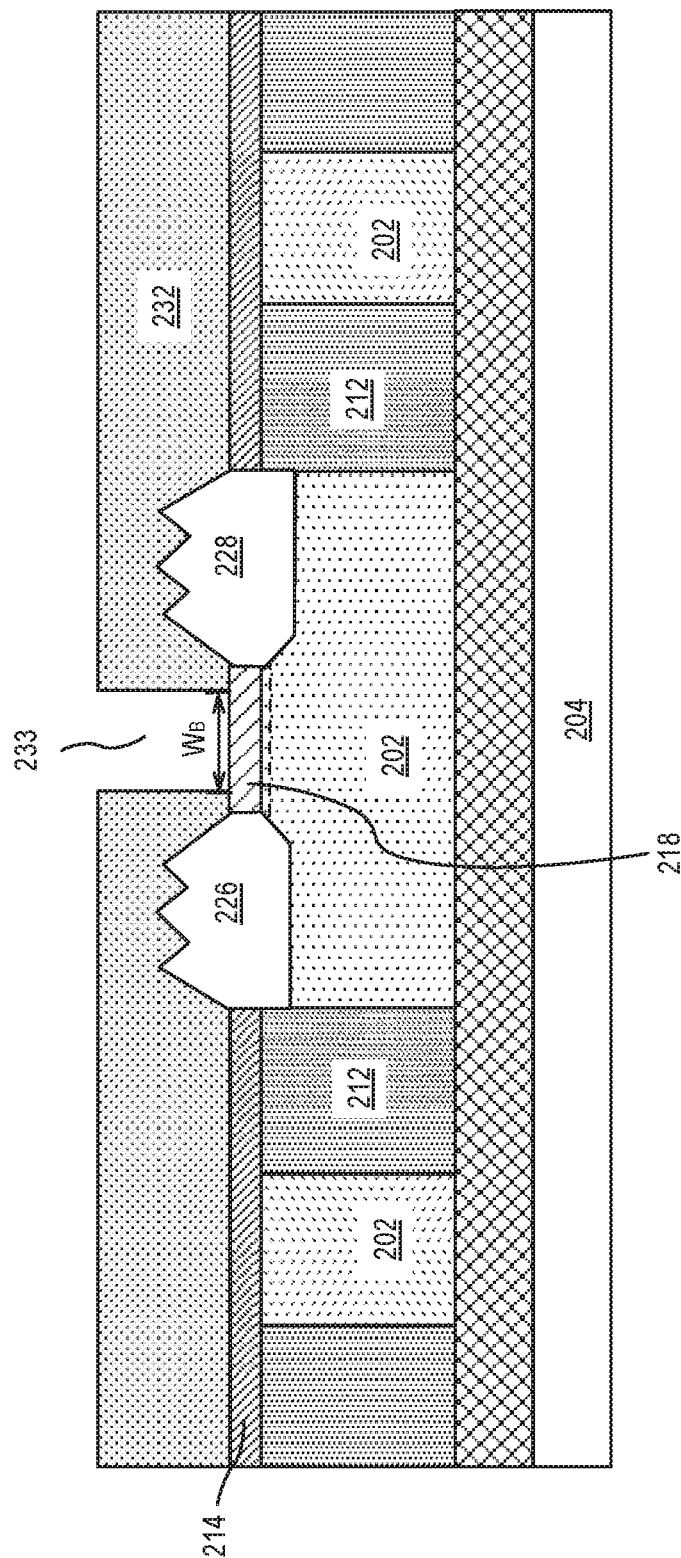
FIG. 2H illustrates a cross-sectional view of the structure of FIG. 2G following the formation of a gate opening in the dielectric layer over a portion of the polarization charge inducing layer.
Figure 21:
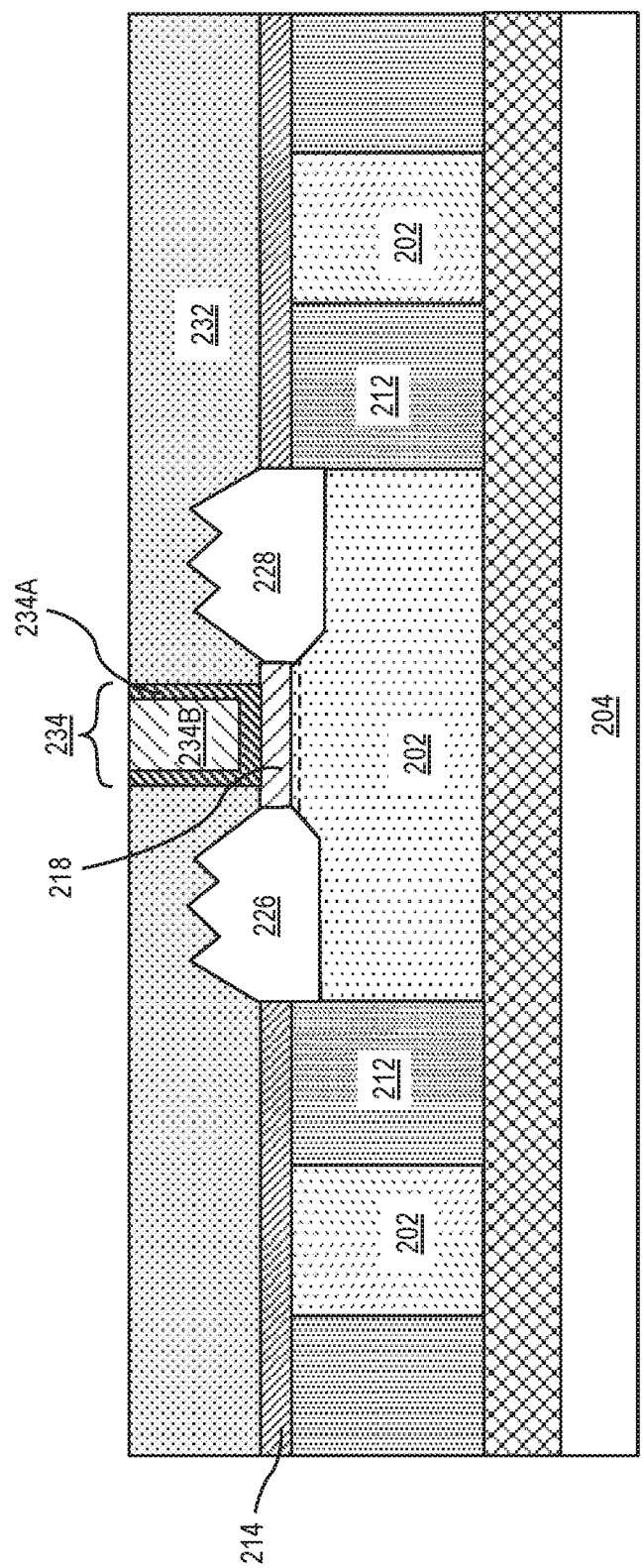

FIG. 2H illustrates a cross-sectional view of the structure of FIG. 2G following the formation of a gate opening 233 in the third dielectric layer 232 over a portion of the polarization charge inducing layer 218. In an embodiment, a photoresist mask (not shown) is patterned over the third dielectric layer 232, where the pattern defines a location for an opening to be formed relative to the polarization charge inducing layer 218. In one embodiment, a plasma etch process is utilized to form the opening 233 in the third dielectric layer 232, selectively to the underlying polarization charge inducing layer 218 as shown in the cross-sectional illustration of FIG. 2H. The gate opening 233 may expose a portion of the isolation 212 (not shown). In an embodiment, gate opening 233 has a width, at the bottom of the opening, $W_B$, that is approximately between 50 nm-500 nm as shown in the cross-sectional illustration of FIG. 2H.

FIG. 2I illustrates a cross-sectional view of the structure of FIG. 2H following the formation of a gate 234 in the gate opening 233 on the polarization charge inducing layer 218. In an embodiment, a gate dielectric layer 234A is first blanket deposited on a portion of the polarization charge inducing layer 218 exposed by the gate opening 233, and on the third dielectric layer 232. The gate dielectric layer 234A is also disposed on sidewalls of the third dielectric layer 232 in the gate opening 233. Suitable materials and thicknesses for the gate dielectric layer 234A are same as or substantially the same as the material and thicknesses of the gate dielectric layer 106A. In an embodiment, the gate dielectric layer 234A, is formed by an atomic layer deposition (ALD) process or a PVD process. A gate electrode layer 234B is then blanket deposited on the gate dielectric layer 234A in the gate opening 233. Examples of the gate electrode layer 234B include a material that is the same as or substantially the same as the material of the gate electrode layer 106B described in association with FIG. 1A. In an embodiment, the gate electrode 222B includes a layer of a work function metal deposited in the opening 233 on the gate dielectric layer 234A and a gate cap layer deposited on the work function metal. After deposition of the gate dielectric layer 234A and the gate electrode layer 234B, a planarization process is performed to remove the gate dielectric layer 234A and the gate electrode layer 234B from an uppermost surface of the third dielectric layer 232. In an embodiment, the planarization process includes a chemical mechanical polish process, where the CMP process forms a gate 234 having an uppermost surface that is co-planar or substantially co-planar with the uppermost surface of the third dielectric layer 232 as shown in the cross-sectional illustration of FIG. 2I.

Figure 2J:
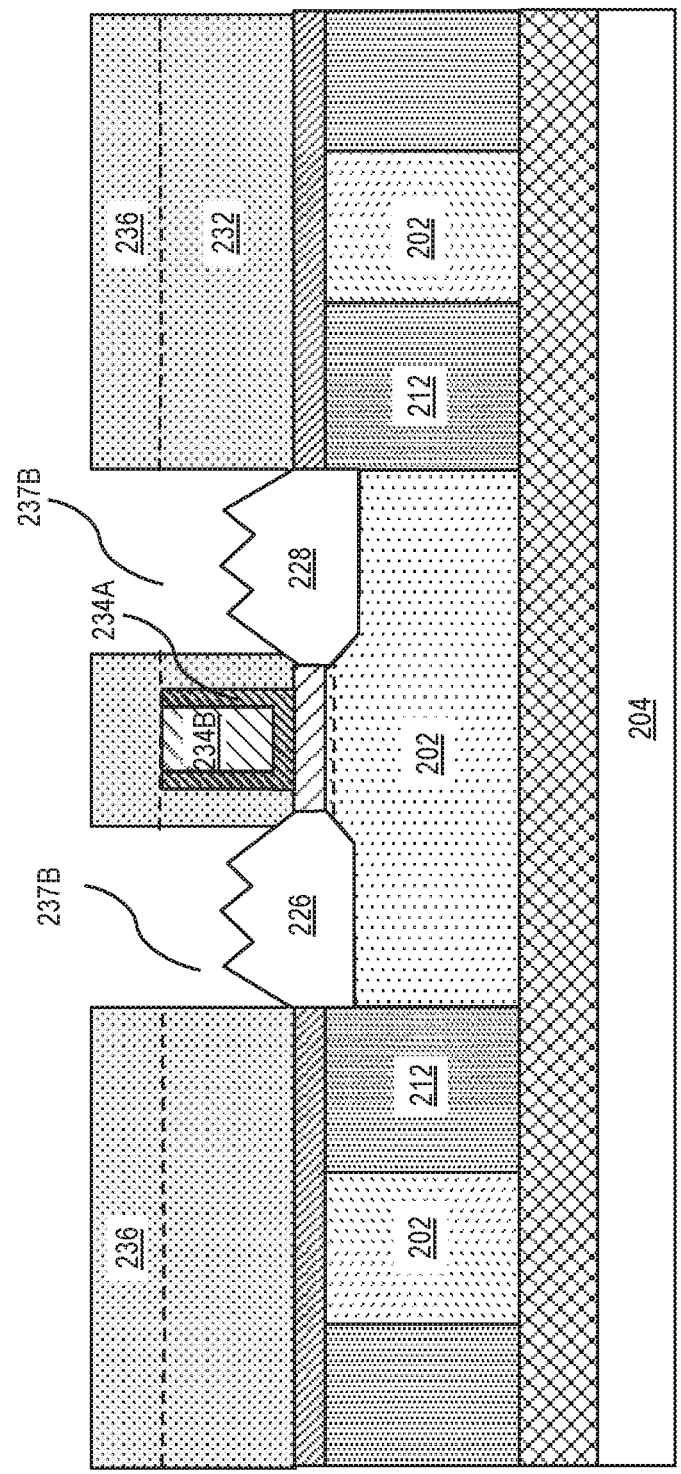
FIG. 2J illustrates a cross-sectional view of the structure of FIG. 2I following the formation of gate, drain and source contact openings above the gate, drain structures and source structures respectively, in accordance with embodiments of the present disclosure.

FIG. 2J illustrates a cross-sectional view of the structure of FIG. 2I following the formation of source and drain contact openings 237A and 237B, respectively above the source structure and drain structure, respectively, in accordance with embodiments of the present disclosure. In an embodiment, a fourth dielectric layer is blanket deposited onto the structure of FIG. 2I. The fourth dielectric layer 236 has a material composition that is the same or substantially the same as the material composition of the third dielectric layer 232 and is formed by deposition methods utilized to form the third dielectric layer 232. In an embodiment, a photoresist mask (not shown) is patterned over the fourth dielectric layer 236 where the pattern defines a location for the opening 237A and the opening 237B to be formed relative to the source structure 226 and the drain structure 228, respectively. In one embodiment, a plasma etch process is utilized to form the opening 237A and the opening 237B in the fourth dielectric layer 236 and in third dielectric layer 232, selectively to the underlying source structure 226 and the drain structure 228, respectively. The plasma etch may cause some corner rounding of the corrugated upper surfaces of the source structure 226 and drain structure 228.

Figure 2K:
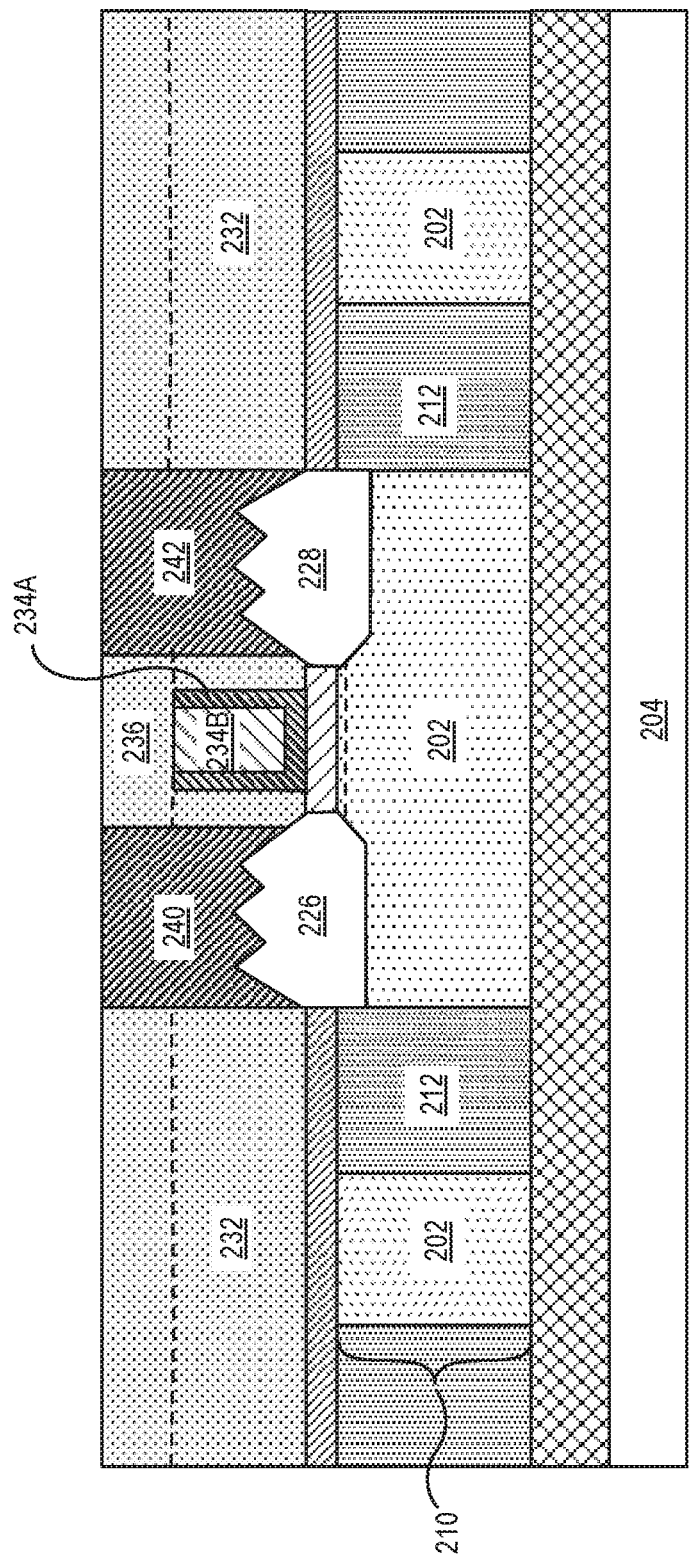
FIG. 2K illustrates a cross-sectional view of the structure of FIG. 2J following the formation of gate contact, drain contact and source contact in the openings.

FIG. 2K illustrates a cross-sectional view of the structure of FIG. 2J following the formation of source contact 240 and drain contact 242 in the openings 237A and 237B, respectively. In an embodiment, one or more layers of contact metal are deposited inside each of the openings 237A and 237B on exposed surfaces of the source structure 226 and on exposed surfaces of the drain structure 228, respectively. In the illustrative embodiment, the one or more layers of the contact metal are also blanket deposited on the uppermost surface and on sidewalls of the fourth dielectric layer 236 and on sidewalls of the third dielectric layer 232. In an embodiment, the one or more layers of contact metal are deposited using a plasma enhanced chemical vapor deposition (PECVD) or an ALD process. In an embodiment, suitable contact metals include metals such as but not limited to Ti, Al or Ni. In an embodiment, a tungsten capping layer is deposited on the one or more layers of contact metal. In an embodiment, where the tungsten capping layer is deposited on the one or more layers of contact metal, the one or more layers of contact metal is first deposited on the bottom and on the sides of the opening 237A and 237B and the tungsten capping layer is deposited to fill the remaining portion of the openings 237A and 237B. In an embodiment, the one or more layers of contact metal is deposited to a thickness in the range of 10-30 nm, and the tungsten capping layer is deposited to fill the remaining portion of each of the openings 237A and 237B.

A planarization process is carried out to remove the one or more layers of contact metal from the uppermost surface of the fourth dielectric layer 236. In one embodiment, the planarization process includes a chemical mechanical polish (CMP) process. The CMP process removes all the one or more layers of contact metal from the uppermost surfaces of the fourth dielectric layer 236. The CMP process leaves the one or more layers of contact metal in the openings 237A and 237B to form a source contact 240 and a drain contact 240 as shown in the cross-sectional illustration of FIG. 2I.

Figure 2L:
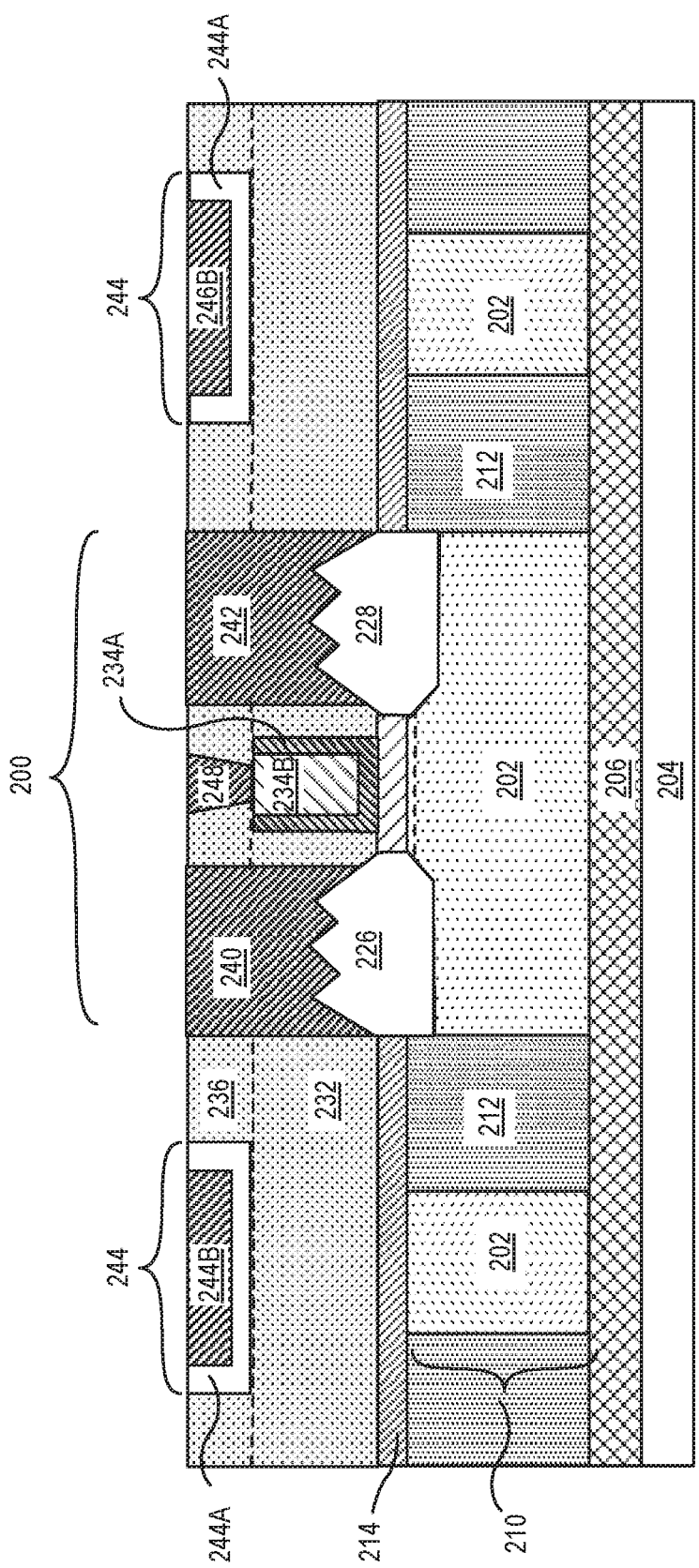
FIG. 2L illustrates a cross-sectional view of the structure of FIG. 2K following the formation of metallization structure above the peripheral structures.

FIG. 2L illustrates a cross-sectional view of the structure of FIG. 2K following the formation of a gate contact 248 and metallization structure 244 above the peripheral structures 210 to complete fabrication of transistor structure 200 surrounded by the plurality of peripheral structures 210. In an embodiment, a photoresist mask (not shown) is patterned over the fourth dielectric layer 236 where the pattern defines a location for a gate contact opening. In one embodiment, a plasma etch process is utilized to form the gate contact opening in the fourth dielectric layer 236 exposing the gate dielectric layer 234A and the gate electrode 234B. In an embodiment, formation of the gate contact includes materials and methods described above in connection with the formation of the source contact 240. In an embodiment, the metallization structures 244 is formed after the formation of the gate contact 248. In an embodiment, a mask is formed over the fourth dielectric layer 236 and openings are formed in the fourth dielectric layer 236 above the plurality of peripheral structures 210.

The metallization structure 244 may formed by a damascene or a dual damascene process that is well known in the art. In an embodiment, the formation of the metallization structure 244 includes depositing a barrier layer 204A in the openings formed in the fourth dielectric layer 236, and a fill metal 244B formed on the barrier layer 244A. In an embodiment, the barrier layer 244A includes a material such as but not limited to tantalum nitride, tantalum or ruthenium. In an embodiment, the fill metal 244B includes a metal such as W or Cu.

Functionally transistor 200 has one or more features of the transistor 100 described in association with FIG. 1A. The plurality of peripheral structures 210 are electrically inactive due to the absence of the 2DEG.

As discussed above, in instances when the cap 214 exposes an edge portion of the isolation 212, either by design or through accidental misalignment between lithography mask and the transistor region 208 during processing, a polarization charge inducing layer that forms on the first III-N layer 202 and on a portion of the isolation 212 has a shape that is distinct from the polarization charge inducing layer 218, illustrated in FIG. 2D.

FIG. 4A illustrates a cross-sectional view of the structure of FIG. 2D where the polarization charge inducing layer 418 is formed above a portion of the isolation 210. In an embodiment, the portion above the isolation 212 uncovered by the cap 214 has a lateral width between 5 nm-20 nm. In the illustrative embodiment, the MOCVD growth results in the polarization charge inducing layer 418 having edge portions 418A where opposing sidewalls facet and meet to form an apex. Whether or not the faceted sidewalls meet to form an apex may depend on the thickness of the polarization charge inducing layer and the lateral width of the portion above the isolation 212 uncovered by the cap 214.

FIG. 4B illustrates a cross-sectional view of the structure of FIG. 4A following the formation of the mask 222 and patterning of the polarization charge inducing layer 418 and the first III-N layer 202 to form trenches. A patterning process described in association with FIG. 2E is utilized to pattern the polarization charge inducing layer 418. In an embodiment, the etch process patterns the polarization charge inducing layer 418 leaving a central portion 418B of the polarization charge inducing layer above the patterned first III-N layer 202 and edge portions 418A on the isolation 212.

Figure 4C:
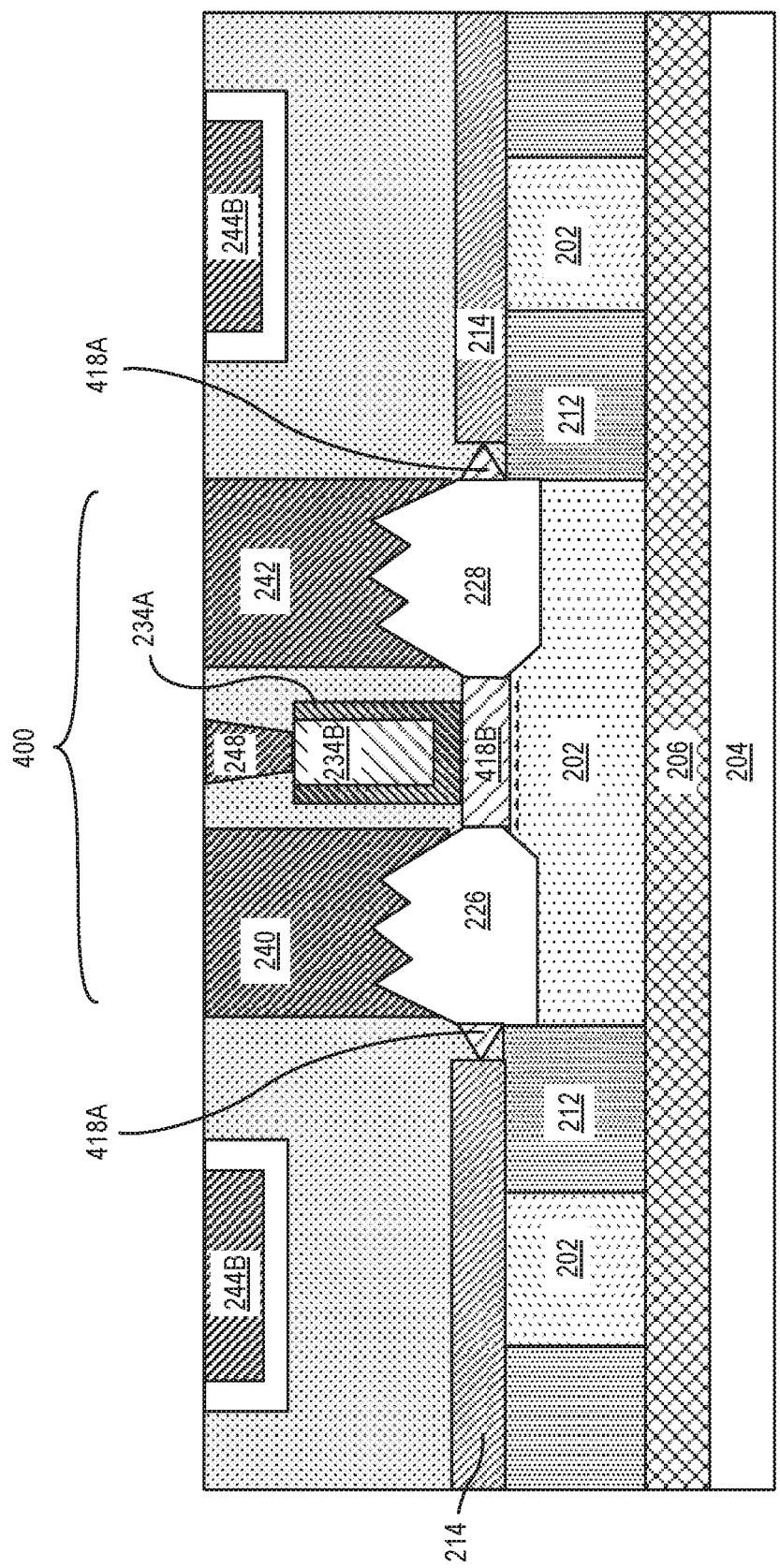
FIG. 4C illustrates a cross-sectional view of a III-N transistor with patterned portions of the polarization charge inducing layer over an isolation, in accordance with embodiments of the present disclosure.

FIG. 4C illustrates a cross-sectional view of a III-N transistor 400 with patterned portions 418A of the polarization charge inducing layer over an isolation 210 and a central portion 418B above the patterned first III-N layer 202, in accordance with embodiments of the present disclosure. In the illustrative embodiment, the source structure 226 and drain structure 228 are also in direct contact with the portions 418A of the polarization charge inducing layer 418. Functionally transistor 400 has one or more features of the transistor 100 or 200 described in association with FIGS. 1A and 2L, respectively.

Figure 5:
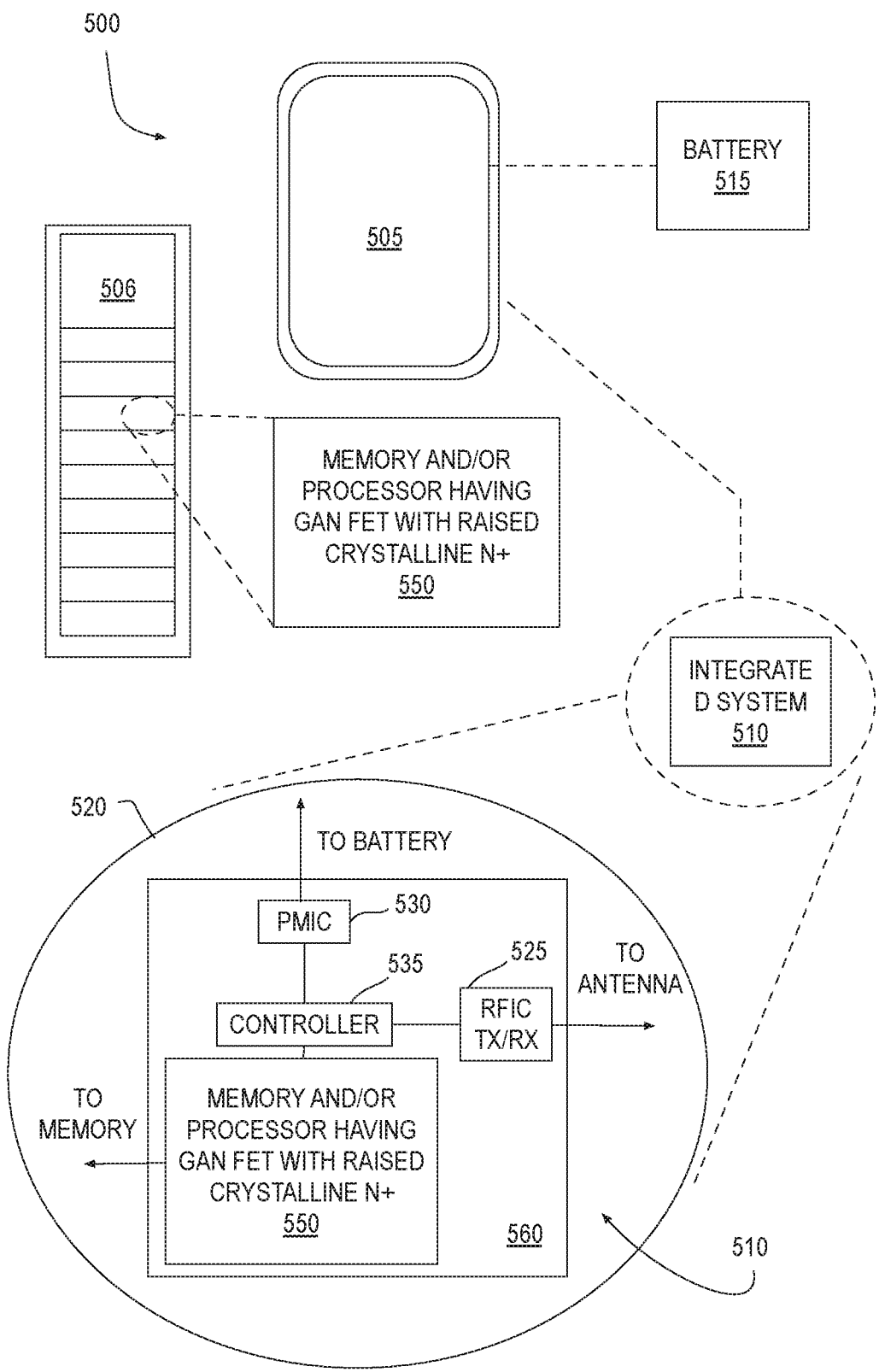
FIG. 5 is a functional block diagram of a group III-N SoC implementation of a mobile computing platform, in accordance with an embodiment of the present disclosure.

FIG. 5 illustrates a system 500 in which a mobile computing platform 505 and/or a data server machine 506 employs an IC including at least one III-N transistor, such as the transistor 100, 200 or 400 adjacent to electrically inactive peripheral structures. The server machine 506 may be any commercial server, for example including any number of high-performance computing platforms disposed within a rack and networked together for electronic data processing, which in the exemplary embodiment includes a packaged monolithic IC 550. The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515.

Whether disposed within the integrated system 510 illustrated in the expanded view 520, or as a stand-alone packaged chip within the server machine 506, packaged monolithic IC 550 includes a memory chip (e.g., RAM), or a processor chip (e.g., a microprocessor, a multi-core microprocessor, graphics processor, or the like) including at least one III-N transistor, such as the transistor 100, 200 or 400 adjacent to electrically inactive peripheral structures. for example, as describe elsewhere herein. The monolithic IC 550 may be further coupled to a board, a substrate, or an interposer 560 along with, one or more of a power management integrated circuit (PMIC) 530, RF (wireless) integrated circuit (RFIC) 525 including a wideband RF (wireless) transmitter and/or receiver (TX/RX) (e.g., including a digital baseband and an analog front end module further comprises a power amplifier on a transmit path and a low noise amplifier on a receive path), and a controller thereof 535.

Functionally, PMIC 530 may perform battery power regulation, DC-to-DC conversion, etc., and so has an input coupled to battery 515 and with an output providing a current supply to other functional modules. As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 5G, 5G, 5G, and beyond. In alternative implementations, each of these board-level modules may be integrated onto separate ICs coupled to the package substrate of the monolithic IC 550 or within a single IC coupled to the package substrate of the monolithic IC 550.

Figure 6:
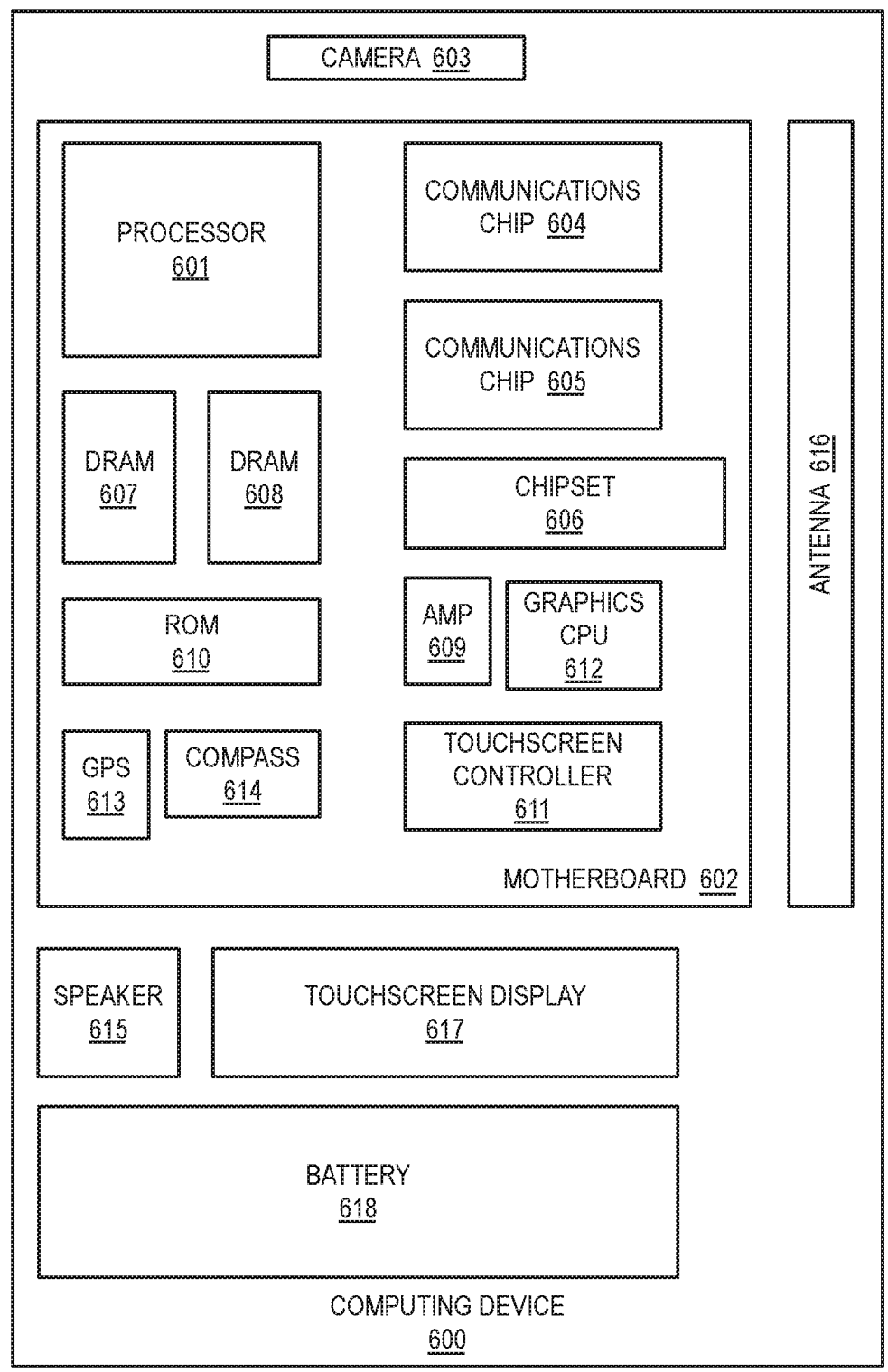
FIG. 6 illustrates a computing device in accordance with embodiments of the present disclosure.

FIG. 6 is a functional block diagram of a computing device 600, arranged in accordance with at least some implementations of the present disclosure. Computing device 600 may be found inside platform 500, for example, and further includes a motherboard 602 hosting a number of components, such as but not limited to a processor 601 (e.g., an applications processor) and one or more communications chips 604, 605. Processor 601 may be physically and/or electrically coupled to motherboard 602. In some examples, processor 601 includes an integrated circuit die packaged within the processor 601. In general, the term "processor" may refer to any device or portion of a device that processes electronic data from registers and/or memory to transform that electronic data into other electronic data that may be stored in registers and/or memory. A device or component of computing device 600 may include transistor(s) or transistor structure(s) includes a plurality of group III-nitride devices, such as such as the transistor 100, 200 or 400 adjacent to electrically inactive peripheral structures 102, 202 integrated with or without silicon CMOS transistors. A device or component of computing device 600 may further include transistor(s) or transistor structure(s) includes a plurality of group III-nitride devices, such as such as the transistor 100, 200 or 400 adjacent to electrically inactive peripheral structures 102, 202 integrated with or without silicon CMOS transistors and at least one communication chip 606, each of which can be physically and electrically coupled to the motherboard 602, or otherwise integrated therein.

In various examples, one or more communication chips 604, 605 may also be physically and/or electrically coupled to the motherboard 602. In further implementations, communication chips 604 may be part of processor 601. Depending on its applications, computing device 600 may include other components that may or may not be physically and electrically coupled to motherboard 602. These other components may include, but are not limited to, volatile memory (e.g., DRAM) 607, 608, non-volatile memory (e.g., ROM) 610, a graphics processor 612, flash memory, global positioning system (GPS) device 613, compass 614, a chipset 606, an antenna 616, a power amplifier 609, a touchscreen controller 611, a touchscreen display 617, a speaker 615, a camera 603, and a battery 618, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 604, 605 may enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 604, 605 may implement any of a number of wireless standards or protocols, including but not limited to those described elsewhere herein. As discussed, computing device 600 may include a plurality of communication chips 604, 605. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Figure 7:
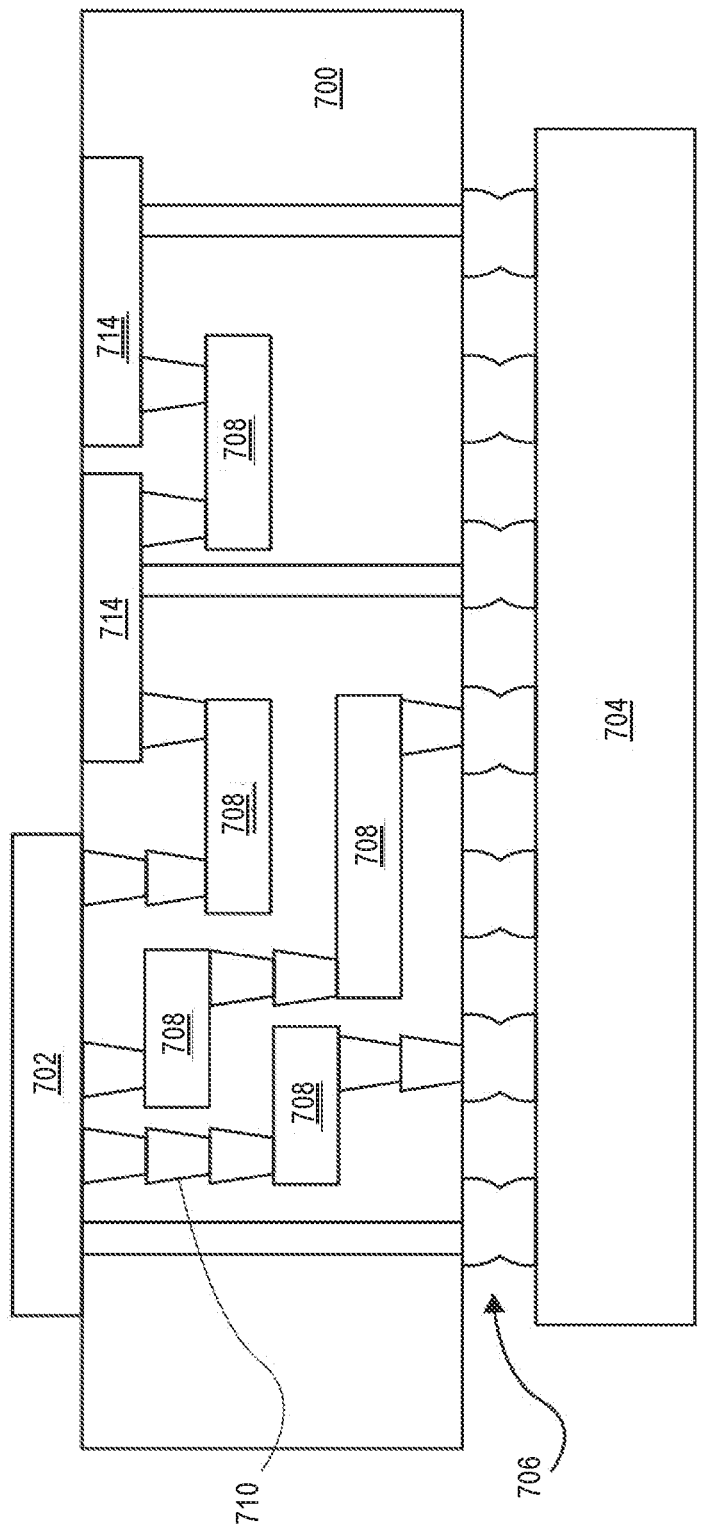
FIG. 7 illustrates an integrated circuit structure in accordance with embodiments of the present disclosure.

FIG. 7 illustrates an integrated circuit structure 700 that includes one or more embodiments of the disclosure. The integrated circuit (IC) structure 700 is an intervening structure used to bridge a first substrate 702 to a second substrate 704. The first substrate 702 may be, for instance, an integrated circuit die. The second substrate 704 may be, for instance, a memory module, a computer mother, or another integrated circuit die. The integrated circuit die may include one or more devices such as a device 100 (transistor) including a terminal structure having a central body and a first plurality of fins, and a second plurality of fins, opposite the first plurality of fins, and source and drain structures on respective first and second plurality of fins, where the source and drain structures are designed for enhanced contact surface area and reducing contact resistance, for example. Generally, the purpose of an integrated circuit (IC) structure 700 is to spread a connection to a wider pitch or to reroute a connection to a different connection. For example, an integrated circuit (IC) structure 700 may couple an integrated circuit die to a ball grid array (BGA) 711 that can subsequently be coupled to the second substrate 704. In some embodiments, the first and second substrates 702/704 are attached to opposing sides of the integrated circuit (IC) structure 700. In other embodiments, the first and second substrates 702/704 are attached to the same side of the integrated circuit (IC) structure 700. And in further embodiments, three or more substrates are interconnected by way of the integrated circuit (IC) structure 700.

The integrated circuit (IC) structure 700 may be formed of an epoxy resin, a fiberglass-reinforced epoxy resin, a ceramic material, or a polymer material such as polyimide. In further implementations, the integrated circuit (IC) structure 700 may be formed of alternate rigid or flexible materials that may include the same materials described above for use in a semiconductor substrate, such as silicon, germanium, and other group III-N, group III-V and group IV materials.

The integrated circuit (IC) structure 700 may include metal interconnects 708 and via 710, including but not limited to through-silicon vias (TSVs) 710. The integrated circuit (IC) structure 700 may further include embedded devices 714, including both passive and active devices. Such devices include, but are not limited to, capacitors, decoupling capacitors, resistors, inductors, fuses, diodes, transformers, III-N transistors such as the transistor 100, 200 or 400 adjacent to electrically inactive peripheral structures, one or more magnetic tunnel junction or resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 700. In accordance with embodiments of the present disclosure, apparatuses or processes disclosed herein may be used in the fabrication of integrated circuit (IC) structure 700.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Thus, embodiments of the present disclosure include group III-Nitride (III-N) devices with improved RF performance and methods of fabrication.

In first examples, a device, includes a transistor structure. The transistor structure includes a first layer including a first group III-nitride (III-N) material, a polarization charge inducing layer above the first layer, the polarization charge inducing layer including a second III-N material, a gate electrode above the polarization charge inducing layer and a source structure and a drain structure on opposite sides of the gate electrode. The device further includes a plurality of peripheral structures adjacent to transistor structure, where each of the peripheral structure includes the first layer, but lacks the polarization charge inducing layer, an insulating layer above the peripheral structure and the transistor structure, wherein the insulating layer includes a first dielectric material, and a metallization structure coupled to the transistor structure above the peripheral structure.

In second examples, for any of first examples, the thickness of the first layer in the transistor structure is equal to the thickness of the first layer in the plurality of peripheral structures.

In third examples, for any of the first through second examples, the peripheral structure further comprises a cap between the first layer and the insulating layer, where the cap comprises an amorphous material, and where the cap is absent from the transistor structure.

In fourth examples, for any of the first through third examples, the cap includes a dielectric material, and the insulating layer also includes the dielectric material.

In fifth examples, for any of the first through fourth examples, the cap includes a first dielectric material, and the insulating layer includes a second dielectric material.

In sixth examples, for any of the first through fifth examples, the cap has a thickness greater than a thickness of the polarization charge inducing layer.

In seventh examples, for any of the first through sixth examples, further including an isolation between the first layer of the transistor structure and the first layer of the peripheral structure, wherein the cap is over a portion of the isolation.

In eighth examples, for any of the first through seventh examples, the polarization charge inducing layer is also above the isolation.

In ninth examples, for any of the first through eighth examples, the cap includes a dielectric material, and the isolation also includes the dielectric material.

In tenth examples, for any of the first through ninth examples, the cap includes a first dielectric material, and the isolation includes a second dielectric material.

In eleventh examples, for any of the first through tenth examples, the source structure has a portion directly in contact with the cap and the isolation material, and the drain structure has a portion directly in contact with the cap and the isolation material.

In twelfth examples, for any of the first through eleventh examples, the metallization structure is coupled to a source contact or a drain contact of the transistor structure.

In thirteenth examples, for any of the first through twelfth examples, the first III-N material includes binary gallium nitride (GaN) and the second III-N-material includes aluminum.

In fourteenth examples, for any of the first through thirteenth examples, the polarization charge inducing layer has a thickness between 3 nm-20 nm.

In fifteenth examples, for any of the first through fourteenth examples, the source structure and the drain structure each include a material that is lattice matched to the first group III-nitride (III-N) semiconductor material and include n-type impurity dopants.

In sixteenth examples, for any of the first through fifteenth examples, further includes a gate dielectric layer between the gate electrode and the polarization charge inducing layer, wherein the gate dielectric In seventeenth examples, A method of fabricating a semiconductor structure includes forming a first group III-nitride (III-N) material and patterning the first III-N material, to form a transistor region and a plurality of peripheral structures. The method further includes forming isolation regions between the transistor region and the plurality of peripheral structures and between each peripheral structure and forming an insulating layer over the plurality of peripheral structures and over the isolation regions. The method further includes forming a polarization charge inducing layer comprising a second III-N material on the first III-N material, in the transistor region and forming a first recess and a second recess, laterally separated from the first recess, in the second III-N material in the transistor region and in the polarization charge inducing layer. The method further includes forming a source structure in the first recess and a drain structure in the second recess and forming a gate dielectric layer on the polarization charge inducing layer. The method further includes forming a gate electrode on the gate dielectric layer, forming a source contact on the source structure, a drain contact on the drain structure and a gate contact on the gate electrode and forming a metallization structure above the peripheral structure.

In eighteenth examples, for any of the seventeenth examples, the method of forming the isolation regions includes depositing a dielectric layer between the transistor region and the peripheral structure and planarizing the dielectric layer and the second III-N material.

In nineteenth examples, for any of the seventeenth through eighteenth examples, the method of forming an insulating layer includes blanket depositing an insulating layer on the peripheral structure, over the isolation regions and on second III-N material in the transistor region and patterning the insulating layer, the patterning removing the insulating layer from the transistor region.

In twentieth examples, for any of the seventeenth through nineteenth examples, the method of forming the source structure includes growing a third III-N material in the first recess on the second III-N material, and forming the drain structure includes growing the third III-N material in the second recess on the second III-N material, wherein the growing includes forming crystal structures with slanted sidewalls and corrugated uppermost surfaces.

In twenty first examples, for any of the seventeenth through twentieth examples, the method of forming the source structure and the drain structure includes lattice matching to the second III-N material and impurity doping the source structure and the drain structure with n-type impurity dopants.

In twenty second examples, for any of the seventeenth through twenty first examples, the method of forming the metallization structure above the peripheral structure, includes forming a second dielectric layer above the insulating layer, patterning a trench in the second dielectric layer and depositing a barrier layer in the trench and a fill metal on the barrier layer.

In twenty third examples, A system including a processor and a radio transceiver coupled to the processor, wherein the transceiver includes a device. The device includes a transistor structure having a first layer including a first group III-nitride (III-N) material, a polarization charge inducing layer above the first layer, the polarization charge inducing layer including a second III-N material, a gate electrode above the polarization charge inducing layer and a source structure and a drain structure on opposite sides of the gate electrode. The device further includes a plurality of peripheral structures adjacent to transistor structure, where each of the peripheral structure includes the first layer, but lacks the polarization charge inducing layer, an insulating layer above the peripheral structure and the transistor structure, wherein the insulating layer includes a first dielectric material, and a metallization structure coupled to the transistor structure above the peripheral structure.

In twenty fourth examples, for any of the twenty third examples, the peripheral structure further includes a cap between the first layer and the insulating layer, wherein the cap includes an amorphous material, and wherein the cap is absent from the transistor structure.

In twenty fifth examples, for any of the twenty third through twenty fourth examples, further includes an isolation between the first layer of the transistor structure and the first layer of the peripheral structure, wherein the cap is over a portion of the isolation.

What is claimed is:
1. A device, comprising:
  a first layer comprising a first group III-nitride (III-N) material, the first layer comprising a first portion and a substantially coplanar second portion separated from the first portion by an isolation material comprising silicon and oxygen;
  a transistor structure, comprising:
    a polarization charge inducing layer on the first portion of the first layer, the polarization charge inducing layer comprising a second III-N material;
    a gate electrode on the polarization charge inducing layer; and
    a source structure and a drain structure on opposite sides of the gate electrode and epitaxial to the first portion of the first layer, wherein the polarization charge inducing layer contacts and extends between the source structure and the drain structure;
  a peripheral structure adjacent to the transistor structure, wherein the peripheral structure comprises the second portion of the first layer, but lacks the polarization charge inducing layer;
  a cap directly on the second portion of the first layer of the peripheral structure, on the isolation material, and in contact with one of the source structure or the drain structure, wherein the cap comprises an amorphous material comprising carbon and nitrogen, and wherein the cap has a thickness greater than a total thickness of the polarization charge inducing layer;
  an insulating layer above the cap, the peripheral structure, and the transistor structure, wherein the insulating layer comprises silicon and nitrogen; and
  a metallization structure coupled to the transistor structure and extending above the peripheral structure.

2. The device of claim 1, wherein a total thickness of the first portion of the first layer is equal to a total thickness of the second portion of the first layer.

3. The device of claim 1, wherein the cap comprises a carbon doped nitride.

4. The device of claim 3, wherein the insulating layer comprises one of silicon nitride, silicon oxynitride, or carbon doped silicon nitride.

5. The device of claim 1, wherein the source structure and the drain structure each comprise n-type impurity dopants.

6. The device of claim 1, wherein the polarization charge inducing layer is above the isolation material.

7. The device of claim 1, wherein the metallization structure is coupled to a source contact or a drain contact of the transistor structure.

8. The device of claim 1, wherein the first III-N material comprises binary gallium nitride (GaN) and the second III-N-material comprises aluminum.

9. The device of claim 1, further comprising a gate dielectric layer between the gate electrode and the polarization charge inducing layer, wherein the gate dielectric layer comprises a compound of metal and oxygen.

10. A method of fabricating a semiconductor structure, the method comprising:
  forming a first group III-nitride (III-N) material;
  patterning the first III-N material, the patterning forming a transistor region and a substantially coplanar peripheral structure;

forming an isolation material between the transistor region and the peripheral structure, the isolation material comprising silicon and oxygen;

forming a cap directly on the first III-N material and on the peripheral structure and the isolation material, the cap comprising an amorphous material comprising carbon and nitrogen;

forming an insulating layer over the cap, the peripheral structure, and the isolation region wherein the insulating layer comprises silicon and nitrogen;

forming a polarization charge inducing layer comprising a second III-N material on the transistor region, wherein the cap has a thickness greater than a total thickness of the polarization charge inducing layer;

forming a first recess and a second recess, laterally separated from the first recess, in the second III-N material in the transistor region;

forming a source structure in the first recess and a drain structure in the second recess;

forming a gate dielectric layer on the polarization charge inducing layer;

forming a gate electrode on the gate dielectric layer;

forming a source contact on the source structure, a drain contact on the drain structure, and a gate contact on the gate electrode; and forming a metallization structure above the peripheral structure.

11. The method of claim 10, wherein forming the isolation material comprises depositing a dielectric layer between the transistor region and the peripheral structure and planarizing the dielectric layer.

12. The method of claim 10, wherein forming the metallization structure above the peripheral structure comprises forming a dielectric layer above the insulating layer, patterning a trench in the dielectric layer, and depositing a barrier layer in the trench and a fill metal on the barrier layer.

13. The method of claim 10, wherein forming the source structure comprises growing a third III-N material in the first recess on the second III-N material, and forming the drain structure comprises growing the third III-N material in the second recess on the second III-N material, wherein the growing comprises forming crystal structures with slanted sidewalls and corrugated uppermost surfaces.

14. A device, comprising:
a first layer comprising a first group III-nitride (III-N) material, the first layer comprising a first portion and a substantially coplanar second portion separated from the first portion by silicon dioxide isolation material;
a transistor structure, comprising:
a polarization charge inducing layer on the first portion of the first layer, the polarization charge inducing layer comprising a second III-N material;
a gate electrode on the polarization charge inducing layer; and
a source structure and a drain structure on opposite sides of the gate electrode and lattice matched to the first portion of the first layer, wherein the polarization charge inducing layer contacts and extends between the source structure and the drain structure;
a peripheral structure adjacent to the transistor structure, wherein the peripheral structure comprises the second portion of the first layer, but lacks the polarization charge inducing layer;
an amorphous carbon doped nitride cap directly on the second portion of the first layer of the peripheral structure, on the isolation material, and in contact with a sidewall of one of the source structure or the drain structure;
a silicon nitride, silicon oxynitride, or carbon doped silicon nitride insulating layer above the peripheral structure and the transistor structure; and
a metallization structure coupled to the transistor structure and extending above the peripheral structure.

15. The device of claim 14, wherein a total thickness of the first portion of the first layer is equal to a total thickness of the second portion of the first layer.

16. The device of claim 14, wherein the amorphous carbon doped nitride cap has a total thickness greater than a total thickness of the polarization charge inducing layer.

17. The device of claim 14, wherein the source structure and the drain structure each comprises n-type impurity dopants.

* * * * *